United States Patent [19]

Tani

[11] Patent Number: 5,471,409
[45] Date of Patent: Nov. 28, 1995

[54] LOGIC SIMULATION APPARATUS AND CIRCUIT SIMULATION APPARATUS

[75] Inventor: Takahiro Tani, Itami, Japan

[73] Assignee: Mitsubishi Denki Kabushiki Kaisha, Tokyo, Japan

[21] Appl. No.: 120,438

[22] Filed: Sep. 14, 1993

[30] Foreign Application Priority Data

Oct. 12, 1992 [JP] Japan ........................... 4-272905

[51] Int. Cl.$^6$ ........................................... G06F 17/50
[52] U.S. Cl. ............................... 364/578; 364/488
[58] Field of Search .................... 364/488, 489, 364/490, 491, 578; 395/500

[56] References Cited

U.S. PATENT DOCUMENTS

| | | | |
|---|---|---|---|
| 5,047,971 | 9/1991 | Horwitz | 364/578 |
| 5,202,841 | 4/1993 | Tani | 364/491 |
| 5,278,769 | 1/1994 | Bair et al. | 364/490 |
| 5,305,229 | 4/1994 | Dhar | 364/489 |
| 5,349,539 | 9/1994 | Moriyasu | 364/578 |
| 5,359,534 | 10/1994 | Fujiki et al. | 364/489 |
| 5,379,232 | 1/1995 | Konoda | 364/489 |

OTHER PUBLICATIONS

"Automated Extraction of SPICE Circuit Models from Symbolic Gate Matrix Layout with Printing" by Freeman et al., IEEE 23rd Design Automation Conference, 1986, pp. 418–424.

"Resistance Extraction in a Hieriarchical IC Artwork Verification System" by Mori et al., IEEE 1985, pp. 196–198.

"Excl: A Circuit Extractor for IC Designs" by S. P. McCormick, IEEE 21st Design Automation Conference, 1984, pp. 616–623.

"Principles of CMOS VLSI Design–A System Perspective", pp. 39–41; 124–125, N. H. E. Weste, et al., Addison–Wesley Publishing Company, 1985.

Primary Examiner—Vincent N. Trans
Attorney, Agent, or Firm—Oblon, Spivak, McClelland, Maier & Neustadt

[57] ABSTRACT

There are provided a logic simulator apparatus and a circuit simulation apparatus capable of simulation based on signal propagation delay time with high reliability. A voltage drop calculating portion (9) calculates a voltage drop value (Vi) on the basis of power-supply information (D4), drain current (Ii) and voltage drop resistance (Ri). A propagation delay calculating portion (10) calculates delay time (Di) required for each element to propagate a logic signal value on the basis of gain coefficient ($\beta$i), interconnection parasitic capacitance (Cj) and voltage drop value (Vi). A logic simulation performing portion (12) performs the logic simulation on the basis of the circuit connection data (D22) provided with the delay time (Di). Accordingly, logic and circuit simulation can be accomplished on the basis of the signal propagation delay time with high reliability.

8 Claims, 19 Drawing Sheets

LOGIC SIMULATION APPARATUS AND CIRCUIT SIMULATION APPARATUS

BACKGROUND OF THE INVENTION

1. Field of the Invention

The present invention relates to logic simulation apparatuses and circuit simulation apparatuses for verifying circuit operation characteristics of logic circuits.

2. Description of the Background Art

FIG. 21 is a block diagram showing structure of a conventional logic simulation apparatus having a function of calculating signal propagation delay time.

As shown in the figure, a layout pattern data storing portion 1 provides a data extracting portion 2 with layout pattern data D1 defining layout pattern of a logic circuit which is an objective of the logic simulation.

The data extracting portion 2 extracts circuit data D2 including circuit connection data defining relation of connections among elements constituting the logic circuit, circuit constant data of the elements and interconnection dimension data including information on dimensions of diffusion regions for elements and information on dimensions of interconnections among the elements from the layout pattern data D1, and outputs the same to a gain coefficient calculating portion 5 and a parasitic capacitance calculating portion 6.

A process parameter storing portion 3 outputs process parameters D3 required in a process of manufacturing the logic circuit to the gain coefficient calculating portion 5 and the parasitic capacitance calculation portion 6.

The gain coefficient calculating portion 5 calculates coefficient of gain for each element of the logic circuit on the basis of the circuit constant data in the circuit data D2 and the process parameters D3 and outputs the same to a propagation delay calculating portion 10.

The parasitic capacitance calculating portion 6 calculates parasitic capacitance associated with each interconnection on the basis of the circuit constant data, the dimension information about diffusion regions, the interconnection dimension data in the circuit data D2 and the process parameters D3, and outputs the same to the propagation delay calculating portion 10.

A power-supply voltage storing portion 4 outputs power-supply information D4 including voltage values and internal resistance value of power-supply operating the logic circuit to the propagation delay calculating portion 10.

The propagation delay calculating portion 10 calculates signal propagation delay time required for each element to propagate a logic signal on the basis of the gain coefficient obtained from the gain coefficient calculating portion 5, the parasitic capacitance obtained from the parasitic capacitance calculating portion 6 and the power-supply information D4, and outputs the same to a delay value providing portion 11.

The delay value providing portion 11 provides the elements on the circuit connection data with the signal propagation delay time obtained from the propagation delay calculating portion 10 and outputs the same to a logic simulation performing portion 12.

The logic simulation performing portion 12 performs the logic simulation on the basis of the circuit connection data in which the elements are provided with the signal propagation delay time in the delay value providing portion 11.

The operation of the logic simulation apparatus shown in FIG. 21 will be described below.

First, the data extracting portion 2 extracts from the layout pattern data D1 the circuit data D2 involving the circuit connection data, the circuit constant data for elements and the interconnection dimension data, and outputs the same to the gain coefficient calculating portion 5 and the parasitic capacitance calculating portion 6.

Then the gain coefficient calculating portion 5 calculates gain coefficients for respective elements on the basis of the circuit constant data (channel lengths and channel widths of transistors, etc.) in the circuit data D2 and the process parameters D3 (dielectric constants, film thicknesses of gate oxide films, etc.) and outputs the same to the propagation delay calculating portion 10.

At the same time, the parasitic capacitance calculating portion 6 calculates interconnection parasitic capacitance associated with each interconnection on the basis of the circuit constant data (the channel lengths, channel widths of transistors, etc.), the dimension information of diffusion regions, the interconnection dimension data in the circuit data D2 and the process parameters D3 (dielectric constants and thicknesses of insulating films formed right below interconnection regions, etc.) and outputs the same to the propagation delay calculating portion 10.

Then, the propagation delay calculating portion 10 calculates signal propagation delay time TD for each element on the basis of the gain coefficient and the interconnection parasitic capacitance and outputs the same to the delay value providing portion 11.

Next, the delay value providing portion 11 provides the signal propagation delay time TD to each element in the circuit connection data and outputs the circuit connection data provided with the signal propagation delay time TD to the logic simulation performing portion 12.

Then, by the logic simulation performed on the basis of the circuit connection data provided with the signal propagation delay time TD, the logic simulation is enabled in consideration of the signal propagation delay time of elements in the logic circuit objective to the simulation.

The conventional logic simulation apparatus configured as described above had a problem that the reliability in the signal propagation delay time is low because the signal propagation delay time for respective elements calculated in the propagation delay calculating portion 10 is based only on the coefficients of gain and the interconnection parasitic capacitances.

SUMMARY OF THE INVENTION

According to the present invention, a logic simulation apparatus comprises: layout pattern data providing means for providing layout pattern data defining layout pattern of a logic circuit; data extracting means for extracting, on the basis of the layout pattern, circuit connection data defining relation of connections among elements constituting the logic circuit, circuit constant data for the elements, interconnection dimension data including dimension information of diffusion regions forming the elements and dimension information of interconnections among the elements and divided power-supply line data including a divided power-supply line, in which a power-supply line from an external power-supply input terminal to the elements is divided in branch point units, a length and a width thereof; process parameter providing means for providing a process parameter required in a process of manufacturing the logic circuit; power-supply information providing means for providing power-supply information including a power-supply voltage value and an internal resistance value of the external power-supply for operation of the logic circuit; gain coefficient calculating means for calculating a gain coefficient of each element of the logic circuit on the basis of the circuit constant data and the process parameter; parasitic capacitance value calculating means for calculating an interconnection parasitic capacitance value which is a capacitance value associated with each interconnection of the logic circuit on the basis of the circuit constant data, the interconnection dimension data and the process parameter; conduction current calculating means for calculating a conduction current value flowing when each element of the logic circuit turns on on the basis of the gain coefficient and the power-supply information; resistance value calculating means for calculating a voltage drop resistance value which is a sum of an interconnection resistance value of the power-supply line and the internal resistance value for each element of the logic circuit on the basis of the divided power-supply line data, the process parameter and the internal resistance value of the power-supply information; voltage drop value calculating means for calculating a voltage drop value occurring in the power-supply path extending from the external power-supply to the element when each element of the logic circuit turns on on the basis of the power-supply voltage value in the power-supply information, the conduction current value and the voltage drop resistance value; signal propagation delay calculating means for calculating signal 25 propagation delay time required for each element of the logic circuit to propagate a logic signal on the basis of the gain coefficient, the interconnection parasitic capacitance and the voltage drop value; and logic simulation performing means for performing logic simulation on the basis of the circuit connection data and the signal propagation delay time.

According to the present invention, the signal propagation delay time calculating means in the logic simulation apparatus calculates signal propagation delay time required for each element of the logic circuit to propagate a logic signal on the basis of the voltage drop value occurring in the power-supply path from the external power-supply to the element in addition to the coefficient of gain and the interconnection parasitic capacitance, so that the signal propagation delay time reflecting the voltage drop produced when each element operates can be set for each element of the logic circuit.

As a result, the logic simulation can be based on precise signal propagation delay time for elements.

Preferably, according to the present invention, the logic simulation performing means comprises; output signal control means for performing the logic simulation on the basis of the circuit connection data and the signal propagation delay time and, during the simulation, scheduling expected time of occurrence of an output signal into a queue for simulation time control on the basis of the signal propagation delay time every time a signal change takes place at an input terminal of the element in the logic circuit, transient time overlap detecting means for detecting a plurality of simultaneous transient state elements at which signal changes of the output signals overlap at the same time referring to the queue, total consumption current calculating means for extracting conduction current of each of the plurality of simultaneous transient state elements on the basis of the conduction current values and calculating total consumption current which is a total sum thereof, average resistance value calculating means for extracting a voltage drop resistance value of each of the plurality of simultaneous transient state elements on the basis of the voltage drop resistance value and calculating an average resistance value which is an average thereof, dynamic voltage drop calculating means for calculating a dynamic voltage drop value which is a voltage drop value occurring on a power-supply interconnection path extending from the external power-supply to the simultaneous transient state elements when the plurality of simultaneous transient state elements turn on on the basis of the power-supply voltage value of the power-supply information, the total consumption current and the average resistance value, incremental delay time calculating means for calculating incremental delay time by calculating dynamic signal propagation delay time required for each of the plurality of simultaneous transient state elements to propagate a logic signal on the basis of the gain coefficient, the interconnection parasitic capacitance value and the dynamic voltage drop value and taking a difference from the signal propagation delay time of each of the plurality of simultaneous transient state elements, and output signal correcting means for changing the expected time of occurrence of the output signal in the queue on the basis of the incremental delay time.

According to the present invention, the logic simulation performing means in the logic simulation apparatus includes dynamic voltage drop calculating means for calculating a dynamic voltage drop value which is a voltage drop value occurring on a power-supply interconnection path extending from the power-supply to the simultaneous transient state elements when the plurality of the simultaneous transient state elements turn on on the basis of the power-supply voltage value of the power-supply information, the total consumption current and the average resistance value, incremental delay time calculating means for calculating incremental delay time by calculating dynamic signal propagation delay time required for each of the plurality of simultaneous transient state elements to propagate a logic signal on the basis of the dynamic voltage drop value in addition to the gain coefficient and the interconnection parasitic capacitance value and taking a difference from the signal propagation delay time of each of the plurality of simultaneous transient state elements, and output signal correcting means for changing the expected time of occurrence of the output signal in the queue on the basis of the incremental delay time. Accordingly, when the logic simulation is performed, the signal propagation delay time can be set for each element even in consideration of occurrence of a plurality of simultaneous transient state elements.

As a result, the logic simulation can be accomplished based on more precise signal propagation delay time for elements.

Preferably, according to the present invention, the logic simulation performing means in the logic simulation apparatus comprises; output signal control means for performing the logic simulation on the basis of the circuit connection data and the signal propagation delay time and, in the logic simulation, scheduling expected time of occurrence of an output signal into a queue for simulation time control on the basis of the signal propagation delay time every time a signal change takes place at an input terminal of the element in the logic circuit, transient time overlap detecting means for detecting a plurality of simultaneous transient state elements at which times of signal changes of the output signals overlap referring to the queue, total consumption current calculating means for extracting conduction current of each of the plurality of simultaneous transient state elements on the basis of the circuit connection data and the conduction current value and calculating total consumption current which is a total sum thereof, and message outputting means for outputting a warning message if the total consumption current exceeds a predetermined reference value.

According to the present invention, the logic simulation performing means of the logic simulation apparatus includes total consumption current calculating means for extracting conduction current of each of the plurality of simultaneous transient state elements on the basis of the circuit connection data and the conduction current value and calculating total consumption current which is a total sum thereof, and message outputting means for outputting a warning message if the total consumption current exceeds a predetermined reference value. Accordingly, while the logic simulation is performed, abnormal current supply conditions for the logic circuit can be detected.

As a result, abnormal current supply conditions in the logic circuit can be detected during the logic simulation based on precise signal propagation delay time for elements.

Preferably, in the logic simulation apparatus according to the present invention; the divided power-supply line data extracted by the data extracting means further includes power-supply line connection data defining connection relation of the divided power-supply line, the logic simulation apparatus further comprises partial resistance value calculating means for calculating a partial resistance value which is a resistance value of a partial resistance in the divided power-supply line unit on the basis of the divided power-supply line data and the process parameters, and the logic simulation performing means comprises, output signal control means for performing the logic simulation on the basis of the circuit connection data and the signal propagation delay time and, during the simulation, scheduling expected time of occurrence of an output signal into a queue for simulation time control on the basis of the signal propagation delay time every time a signal change takes place at an input terminal of the element in the logic circuit, transient time overlap detecting means for detecting a plurality of simultaneous transient state elements at which times of occurrence of signal changes of the output signals overlap referring to the queue, partial consumption current calculating means for calculating partial consumption current flowing through each of the internal resistance of the external power-supply and the partial resistance on the basis of the divided power-supply line data, the power-supply information, the partial resistance value and the conduction current value, dynamic voltage drop calculating means for calculating a dynamic voltage drop value which is a voltage drop value occurring on a signal path extending from the external power-supply to the simultaneous transient state element when each of the plurality of simultaneous transient state elements tuns on on the basis of the power-supply voltage value and the internal resistance value of the power-supply information and the partial consumption current and the partial resistance value, incremental delay time calculating means for calculating incremental delay time by calculating dynamic signal propagation delay time required for each of the plurality of simultaneous transient state elements to propagate a logic signal on the basis of the gain coefficient, the interconnection parasitic capacitance value and the dynamic voltage drop value and taking a difference from the signal propagation delay time of each of the plurality of simultaneous transient state elements, and output signal correcting means for changing the expected time of occurrence of the output signal in the queue on the basis of the incremental delay time.

According to the present invention, the logic simulation performing means in the logic simulation apparatus includes partial consumption current calculating means for calculating partial consumption current flowing through each of the internal resistance of the external power-supply and the partial resistance on the basis of the divided power-supply line data with the power-supply line being divided in branch point units, the power-supply information, the partial resistance value and the conduction current value, dynamic voltage drop calculating means for calculating a dynamic voltage drop value which is a voltage drop value occurring on a signal path extending from the external power-supply to the simultaneous transient state elements when each of the plurality of simultaneous transient state elements turns on on the basis of the power-supply voltage value and the internal resistance value of the power-supply information and the partial consumption current and the partial resistance value which is a resistance value of divided power-supply line. Accordingly, a precise dynamic voltage drop value based on the partial consumption current can be obtained for each simultaneous transient state element unit.

As a result, the logic simulation can be based on further more precise signal propagation delay time for elements.

The present invention is also directed to a circuit simulation apparatus comprising: layout pattern data providing means for providing layout pattern data defining layout pattern of a logic circuit; data extracting means for extracting, on the basis of the layout pattern, circuit connection data defining connection relation among elements forming the logic circuit, circuit constant data of the elements, interconnection dimension data including dimension information of diffusion regions forming the elements and dimension information of interconnections among the elements, and divided power-supply line data including divided power-supply line, with the power-supply line being divided in branch point units from an external power-supply input terminal to the elements, length and width thereof and power-supply line connection data defining connection relation of the divided power-supply line; precess parameter providing means for providing process parameters required in a process of manufacturing the logic circuit; power-supply information providing means for providing power-supply information including a power-supply voltage value and an internal resistance value of the external power-supply for operation of the logic circuit; parasitic capacitance value calculating means for calculating an interconnection parasitic capacitance value which is a capacitance value associated with each interconnection of the logic circuit on the basis of the circuit constant data, the interconnection dimension data and the precess parameters; partial resistance value calculating means for calculating a partial resistance value which is a resistance value of a partial resistance in the divided power-supply line unit on the basis of the divided power-supply line data and the process parameters; and circuit simulation performing means for performing the circuit simulation on the basis of the circuit connection data, the power-supply information, the circuit constant data, the interconnection parasitic capacitance value and the partial resistance value. According to the present invention, the circuit simulation performing means in the circuit simulation apparatus performs circuit simulation on the basis of the partial resistance value which is resistance value of the divided power-supply line data in which power-supply line is divided in blanch point units in addition to the circuit connection data, the power-supply information, the circuit constant data and the interconnection parasitic capacitance value. Accordingly, analysis of electric characteristics reflecting dynamic voltage drop is enabled considering the case where a plurality of simultaneous transient state elements occur. As a result, accurate circuit simulation can be made in consideration of precise dynamic voltage drop based on the partial consumption current. Therefore, it is an object of the present invention to provide a logic simulation apparatus and a circuit simulation apparatus capable of performing logic simulation based on the signal propagation delay time with higher reliability. These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
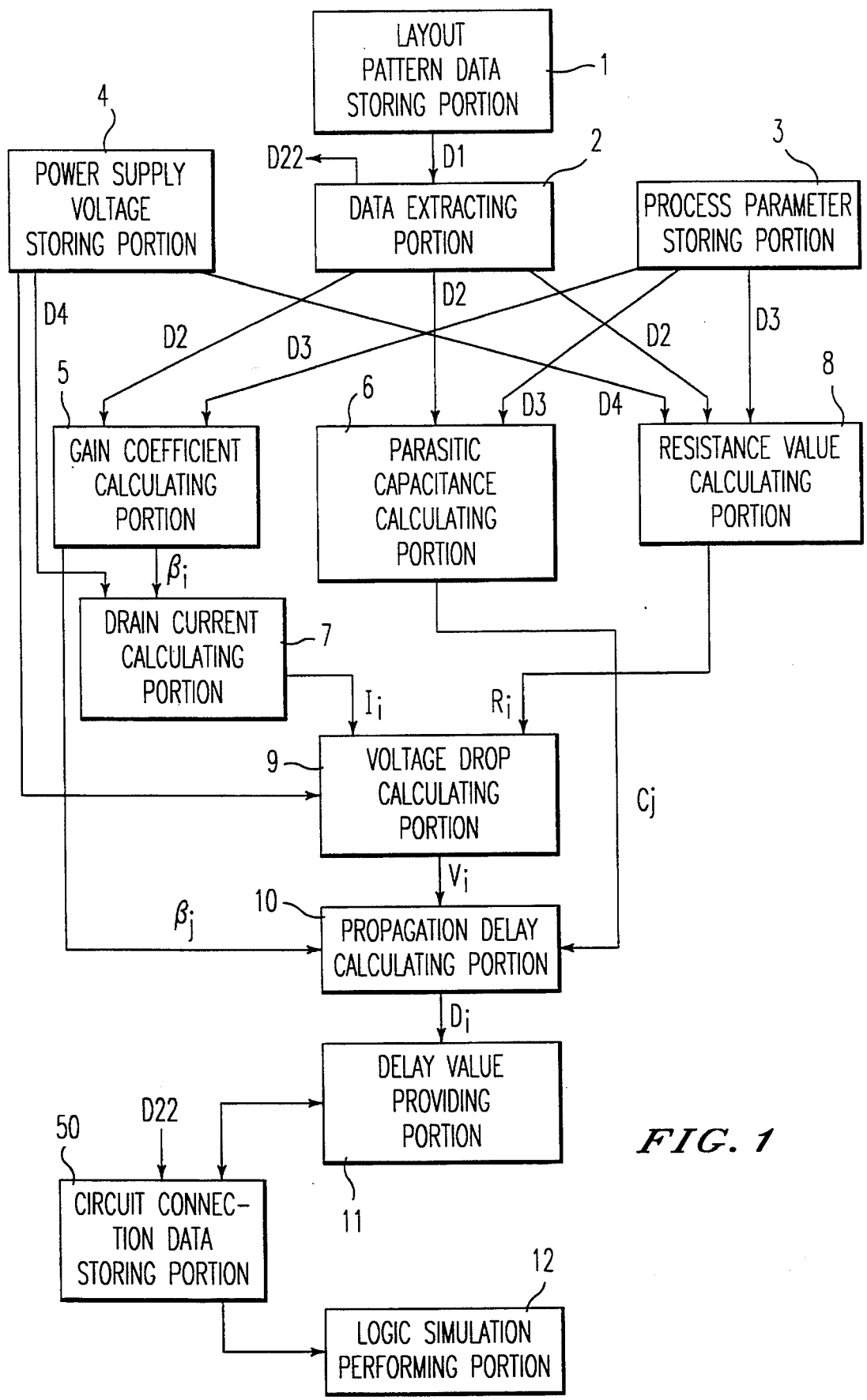
FIG. 1 is a block diagram showing configuration of a logic simulation apparatus according to the first preferred embodiment of the present invention.

FIG. 1 is a block diagram showing configuration of a logic simulation apparatus of the first preferred embodiment of the present invention.

As shown in the figure, a layout pattern data storing portion 1 stores layout pattern data D1 defining layout pattern of a logic circuit which is the objective of the simulation, and outputs the layout pattern data D1 to a data extracting portion 2.

The data extracting portion 2, on the basis of the layout pattern data D1, outputs circuit connection data D22 defining connection relationship among elements constituting the logic circuit to a circuit connection data storing portion 50, and outputs circuit data D2 including circuit constant data of elements, interconnection dimension data including dimension information on diffusion regions of elements and dimension information on interconnections among elements, and power-supply line information including such as lengths and widths of divided power-supply lines in which power-supply line from an external power-supply input terminal to elements is divided for each branch point to a gain coefficient calculating portion 5, a parasitic capacitance calculating portion 6 and a resistance value calculating portion 8.

A process parameter storing portion 3 stores process parameter data D3 required in the process of manufacturing logic circuit, which outputs the process parameters D3 to the gain coefficient calculating portion 5 and the resistance value calculating portion 8.

A power-supply voltage storing portion 4 stores power-supply information D4 including voltage value and internal resistance value of a power-supply operating the logic circuit, which outputs the power-supply information D4 to a drain current calculating portion 7, the resistance value calculating portion 8 and a voltage drop calculating portion 9.

The gain coefficient calculating portion 5 calculates a gain coefficient βi for each element i on the basis of the circuit constant data in the circuit data D2 and the process parameters D3 and outputs to the drain current calculating portion 7 and a propagation delay calculating portion 10.

The parasitic capacitance calculating portion 6 calculates interconnection parasitic capacitance Cj associated with each interconnection on the basis of the circuit constant data, the dimension information of diffusion region and interconnection dimension data in the circuit data D2 and the process parameters D3 and outputs to the propagation delay calculating portion 10.

The drain current calculating portion 7 calculates drain current Ii flowing when each element turns on on the basis of the gain coefficient βi and the power-supply information D4 and outputs to the voltage drop calculating portion 9.

The resistance value calculating portion 8 calculates voltage drop resistance Ri which is a sum of the interconnection resistance value of a power-supply line from the external power-supply input terminal to each element and the internal resistance value of the power-supply on the basis of the power-supply line information in the circuit data D2, the process parameters D3 and the internal resistance value in the power-supply information D4 and outputs to the voltage drop calculating portion 9.

The voltage drop calculating portion 9 calculates a voltage drop value Vi on the basis of the power-supply information D4, the drain current Ii and the voltage drop resistance Ri and outputs to the propagation delay calculating portion 10.

The propagation delay calculating portion 10 calculates delay time Di required for each element to propagate a logic signal value on the basis of the gain coefficient βi, the interconnection parasitic capacitance Cj and the voltage drop value Vi and provides it to the delay value providing portion 11.

The delay value providing portion 11 captures the circuit connection data D22 from the circuit connection data storing portion 50 and provides each element in the circuit connection data with the delay time Di, and stores the same in the circuit connection data storing portion 50 again.

A logic simulation performing portion 12 captures the circuit connection data storing portion 50 the circuit connection data D22 provided with the delay time Di in the delay value providing portion 11 and performs the logic simulation on the basis of the circuit connection data D22.

Figure 2:
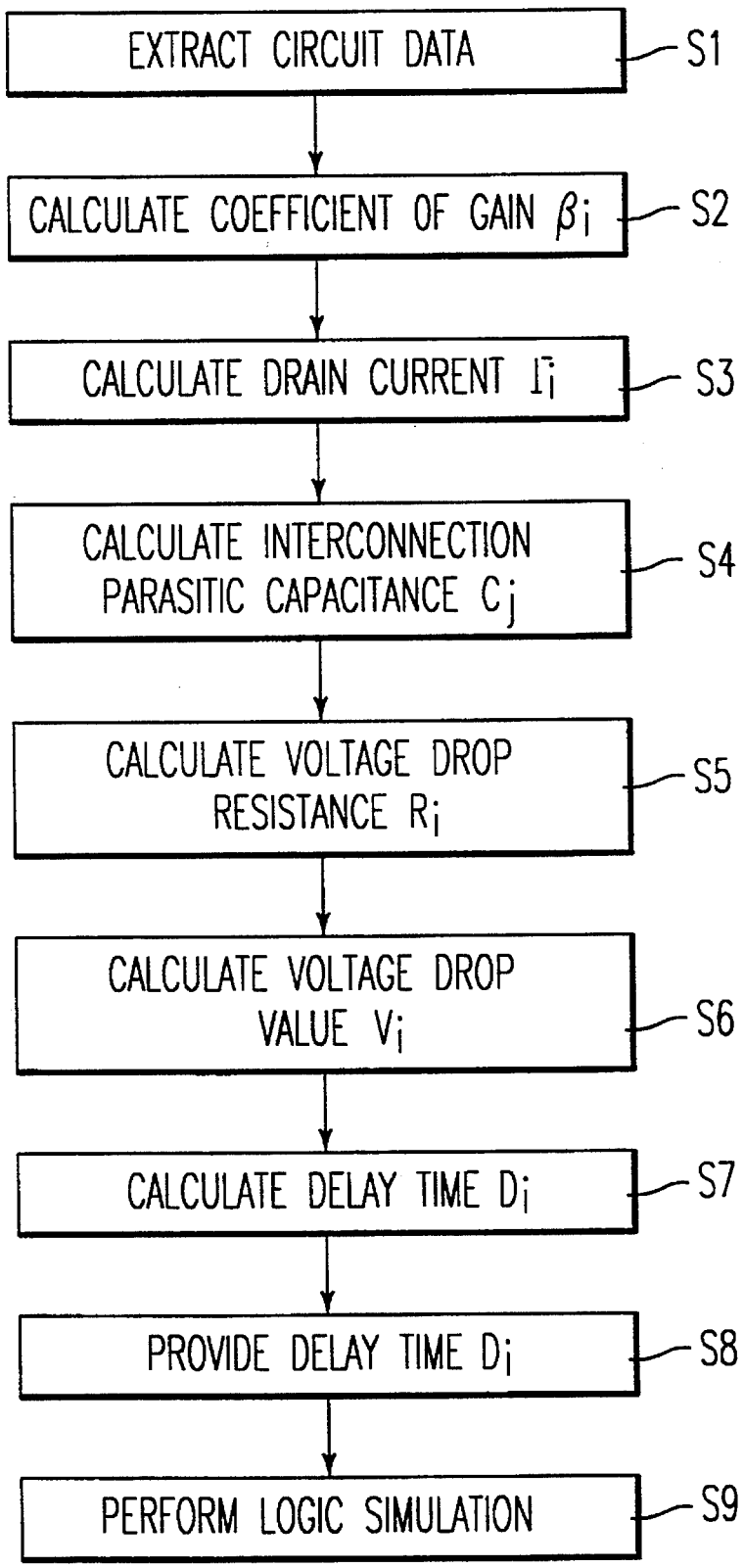
FIG. 2 is a flow chart illustrating operation of the first preferred embodiment.
Figure 3:
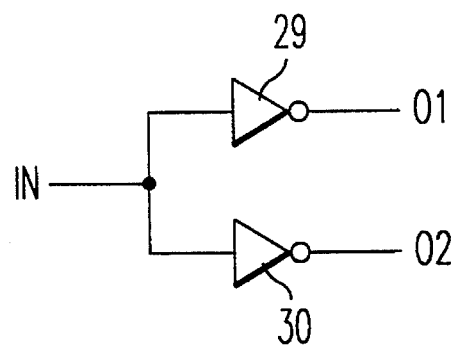
FIG. 3 is a circuit diagram for use in illustrating operation of the preferred embodiments.
Figure 4:
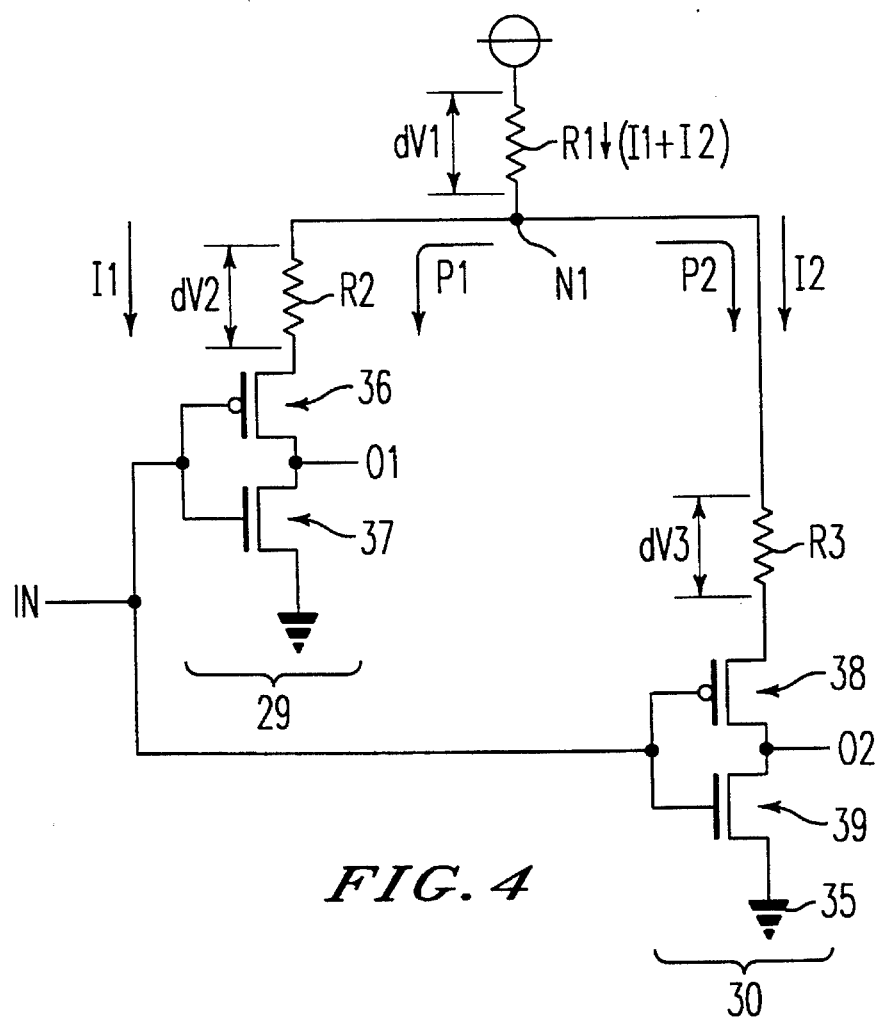
FIG. 4 is a circuit diagram for use in illustrating operation of the preferred embodiments.

FIG. 2 is a flow chart illustrating operation of the logic simulation apparatus of the first preferred embodiment. FIG. 3 and FIG. 4 are circuit diagrams for use in describing the operation.

In FIG. 3, an input signal IN is received at two inverters 29 and 30 in common, an output signal O1 is outputted from the inverter 29 and an output signal O2 is outputted from the inverter 30.

FIG. 4 is a circuit diagram representing the logic circuit of FIG. 3 at the transistor level. The inverter 29 includes a PMOS transistor 36 and an NMOS transistor 37 connected in series between a power-supply $V_{DD}$ and a ground level, which receives the input signal IN at gates of the PMOS transistor 36 and the NMOS transistor 37. The inverter 30 includes a PMOS transistor 38 and an NMOS transistor 39 connected in series between the power-supply and a ground level, which receives the input signal IN at gates of the PMOS transistor 38 and the NMOS transistor 39.

Resistance R1 is the internal resistance of the power-supply $V_{DD}$, resistance R2 is interconnection resistance from a branch point N1 to the source of the PMOS transistor 36, and resistance R3 is interconnection resistance from the branch point N1 to the source of the PMOS transistor 38. The dV1 represents a voltage drop value due to the resistance R1, the dV2 represents a voltage drop value due to the resistance R2, and the dV3 represents a voltage drop value due to the resistance R3.

Figure 5:
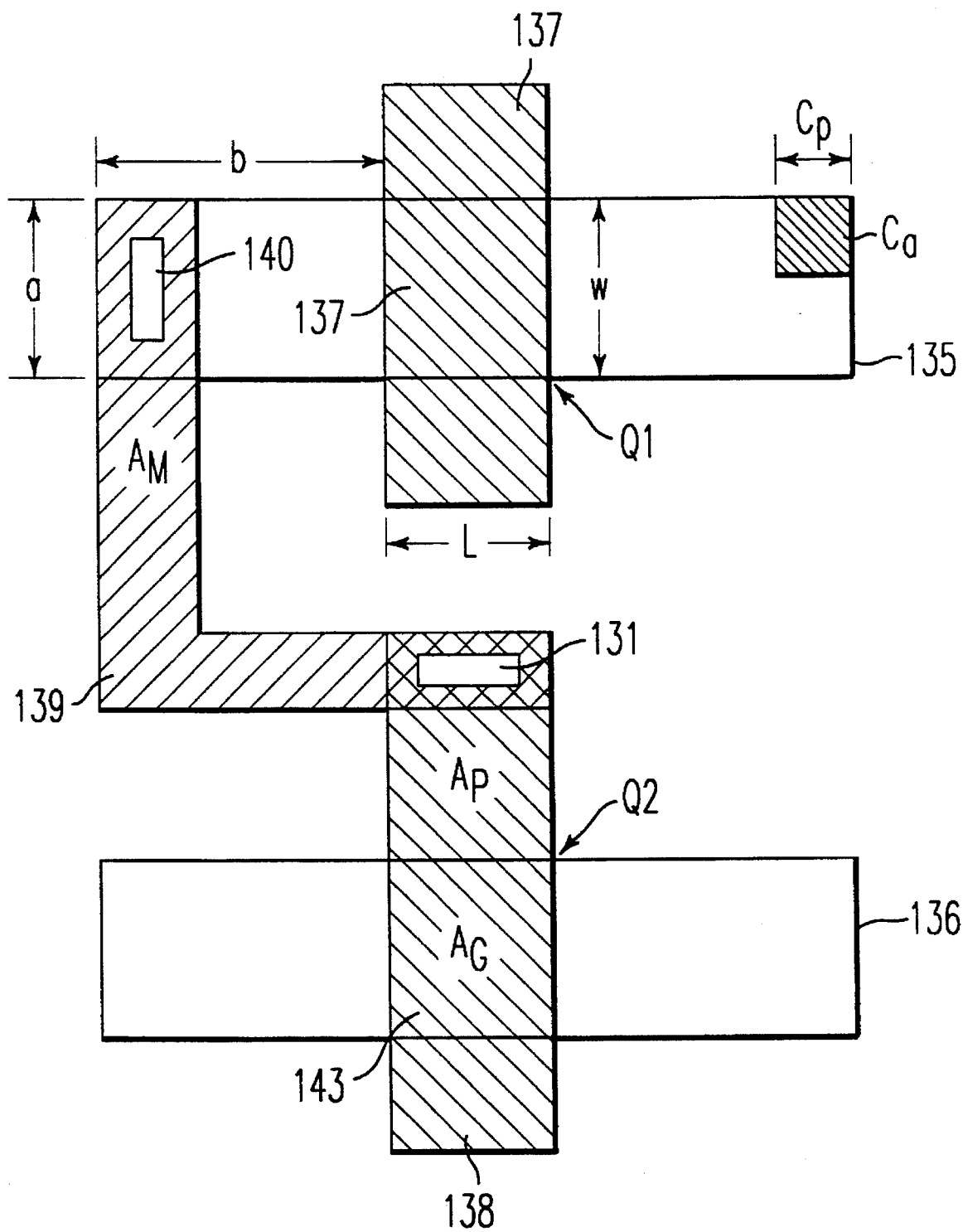
FIG. 5 is a plan view for use in illustrating operation of the preferred embodiments.

FIG. 5 is a diagram for use in describing the process parameters D3 in detail. FIG.5 shows one example of the layout pattern data of two transistors Q1 and Q2, where 135 and 136 denote diffusion regions, 137 and 138 denote polysilicon regions, 139 denotes an aluminum interconnection region, and 140 and 131 denote contact regions, respectively. The regions 142 and 143 in which the diffusion regions 135 and 136 overlap with the polysilicon regions 137 and 138 represent gate formation regions of the transistors Q1 and Q2.

On the basis of FIG. 2 and referring to FIGS. 3 through 5, the operation of the logic simulation apparatus of the first preferred embodiment will be described below.

First, in step S1, on the basis of the layout pattern data D1 obtained from the layout pattern data storing portion 1, the data extracting portion 2 extracts the circuit data D2 including the circuit connection data defining connection relation among elements constituting the logic circuit, the circuit constant data of elements, the interconnection dimension data including the dimension information on diffusion regions of elements and dimension information on interconnections among elements and the power-supply line information including the divided power-supply lines in which power-supply lines from the external power-supply terminal to elements are divided for each branch point, lengths and widths thereof and the like, and outputs the same to the gain coefficient calculating portion 5, the parasitic capacitance calculating portion 6, and the resistance value calculating portion 8.

Next, in step S2, on the basis of the circuit constant data in the circuit data D2 and the process parameters D3 obtained from the process parameter storing portion 3, the gain coefficient calculating portion 5 calculates the gain coefficient βi for each element i by applying the expression 1 and outputs the same to the drain current calculating portion 7 and the propagation delay calculating portion 10.

$$\beta i = \mu_{\mathit{eff}}(W/L) \cdot (\epsilon_{ox}/T_{ox}) \tag{1}$$

In the expression 1, W represents a channel width of a MOS transistor and L represents a channel length of a MOS transistor, which are classified into the circuit constant data. Also, $\epsilon_{ox}$ represents a dielectric constant of a gate oxide film, $T_{ox}$ represents a film thickness of a gate oxide film and $\mu_{\mathit{eff}}$ represents effective surface mobility of electrons in channel, which are classified into the process parameters D3.

In step S3, the drain current calculating portion 7 calculates the drain current Ii flowing when each element i turns on by applying the expression 2 on the basis of the gain coefficient βi and the power-supply information D4 obtained from the power-supply voltage storing portion 4 and outputs to the voltage drop calculating portion 9.

$$Ii = fi(\beta, V_{DD}) \tag{2}$$

In the expression 2, fi is a function based on the gain coefficient βi and the power-supply voltage $V_{DD}$.

Next, in step S4, the parasitic capacitance calculating portion 6 applies the expression 3 to calculate interconnection parasitic capacitance Cj associated with each interconnection j on the basis of the circuit constant data, dimension information of diffusion regions, and interconnection dimension data in the circuit data D2 obtained from the data extracting portion 2 and the process parameters D3, and outputs the same to the propagation delay calculating portion 10.

$$Cj = \frac{\epsilon_1}{t_1} \cdot Al + \sum_{p=1}^{k} \left\{ \frac{\epsilon_p}{t_p} \cdot A_p \right\} + \tag{3}$$

$$\sum_{n=1}^{m} \{a_n \cdot b_n \cdot Ca + 2(a_n + b_n)Cp\} + \sum_{G=1}^{k} \left\{ \frac{\epsilon_{ox}}{T_{ox}} \cdot A_G \right\}$$

In the expression 3, $A_p$ represents polysilicon area for gate interconnection (refer to FIG. 5), which is classified into the circuit constant data. The $a_n$ and $b_n$ respectively represent a width and a length of a drain diffusion region (corresponding to a and b in FIG. 5), which are classified into the dimension information of diffusion region. The Al represents an interconnection area, which is classified into the interconnection dimension data. The $\epsilon_1$ and $t_1$ represent a dielectric constant and a thickness of an insulating film formed right under an aluminum interconnection region (corresponding to the aluminum interconnection region 139 in FIG. 5), $\epsilon_p$ and $t_p$ represent dielectric constant and a thickness of an insulating film formed right under the polysilicon region (corresponding to the polysilicon regions 137 and 138 in FIG. 5), Ca represents junction capacitance per unit length of a drain region and a semiconductor layer right under the same (refer to FIG. 5), Cp represents peripheral capacitance per unit length of a drain diffusion region and a semiconductor layer in the vicinity thereof (refer to FIG. 5), $\epsilon_{ox}$ and $t_{ox}$ represent dielectric constant and a thickness of a gate oxide film, and $A_G$ represents a gate area (refer to FIG. 5), respectively, which are classified into the process parameters D3. The k represents the number of gate terminals joined to a signal line j, and m represents the number of drain/source terminals connected to the signal line j.

In step S5, the resistance value calculating portion 8 applies the expression 4 to calculate voltage drop resistance Ri which is a sum of the interconnection resistance of power-supply line and the internal resistance for each element on the basis of the power-supply line information in the circuit data D2, the process parameters D3 and the power-supply information D4 obtained from the power-supply voltage storing portion 4, and outputs the same to the voltage drop calculating portion 9.

$$Ri = R1 + \sum_{j=1}^{k} \left\{ \frac{L_{ij}}{W_{ij}} \cdot Rs \right\} \tag{4}$$

In the expression 4, $L_{ij}$ and $W_{ij}$ represent interconnection length and interconnection width of a divided power-supply line, which are classified into the power-supply line information. The Rs represents a sheet resistivity value per unit area, which is classified into the process parameters D3. The R1 (refer to FIG. 4) represents an internal resistance value of the power-supply, which is classified into the power-supply information D4.

In the example of the circuit in FIG. 4, the voltage drop resistance Ri for the inverter 29 is (R1+R2), and the voltage drop resistance Ri for the inverter 30 is (R1+R3).

Then in step S6, the voltage drop calculating portion 9 applies the expression 5 to calculate a voltage drop value Vi at a source terminal for turn-on of each element i on the basis of the power-supply voltage value $V_{DD}$ obtained from the power-supply information D4, the drain current Ii and the voltage drop resistance Ri, which is outputted to the propagation delay calculating portion 10.

$$Vi = V_{DD} - (Ii \times Ri) \tag{5}$$

As shown in the expression 6, a value found by subtracting the voltage drop amount based on the voltage drop resistance Ri and the drain current Ii from the power-supply voltage value $V_{DD}$ is defined here as a voltage drop value Vi. Subsequently, in step S7, on the basis of the gain coefficient βi, the interconnection parasitic capacitance Cj and the voltage drop value Vi, the propagation delay calculating portion 10 applies the expression 6 to calculate the delay time Di required for each element i to propagate a logic signal value and outputs to the delay value providing portion 11.

$$Di = fd(\beta i, Cj, Vi) \tag{6}$$

In the expression 6, the delay time Di is a function fd based on the gain coefficient βi, the interconnection parasitic capacitance Cj and the voltage drop value Vi.

Next, in step S8, the delay value providing portion 11 captures the circuit connection data D22 from the circuit connection data storing portion 50 and provides each element i in the circuit connection data D22 with the delay time Di, and stores the circuit connection data provided with the delay time Di into the circuit connection data storing portion 50 again.

Finally, in step S9, the circuit connection data D22 provided with the delay time Di is captured from the circuit connection data storing portion 50, and the logic simulation is implemented on the basis of the circuit connection data S22.

The delay time Di for each element i is calculated in consideration of the voltage drop value Vi according to the expression 6, so that the preciseness is higher in comparison with conventional ones. Accordingly, the logic simulation performing portion 12 can accomplish the logic simulation on the basis of signal propagation delay time for elements with higher reliability.

<Second Preferred Embodiment>

Figure 6:
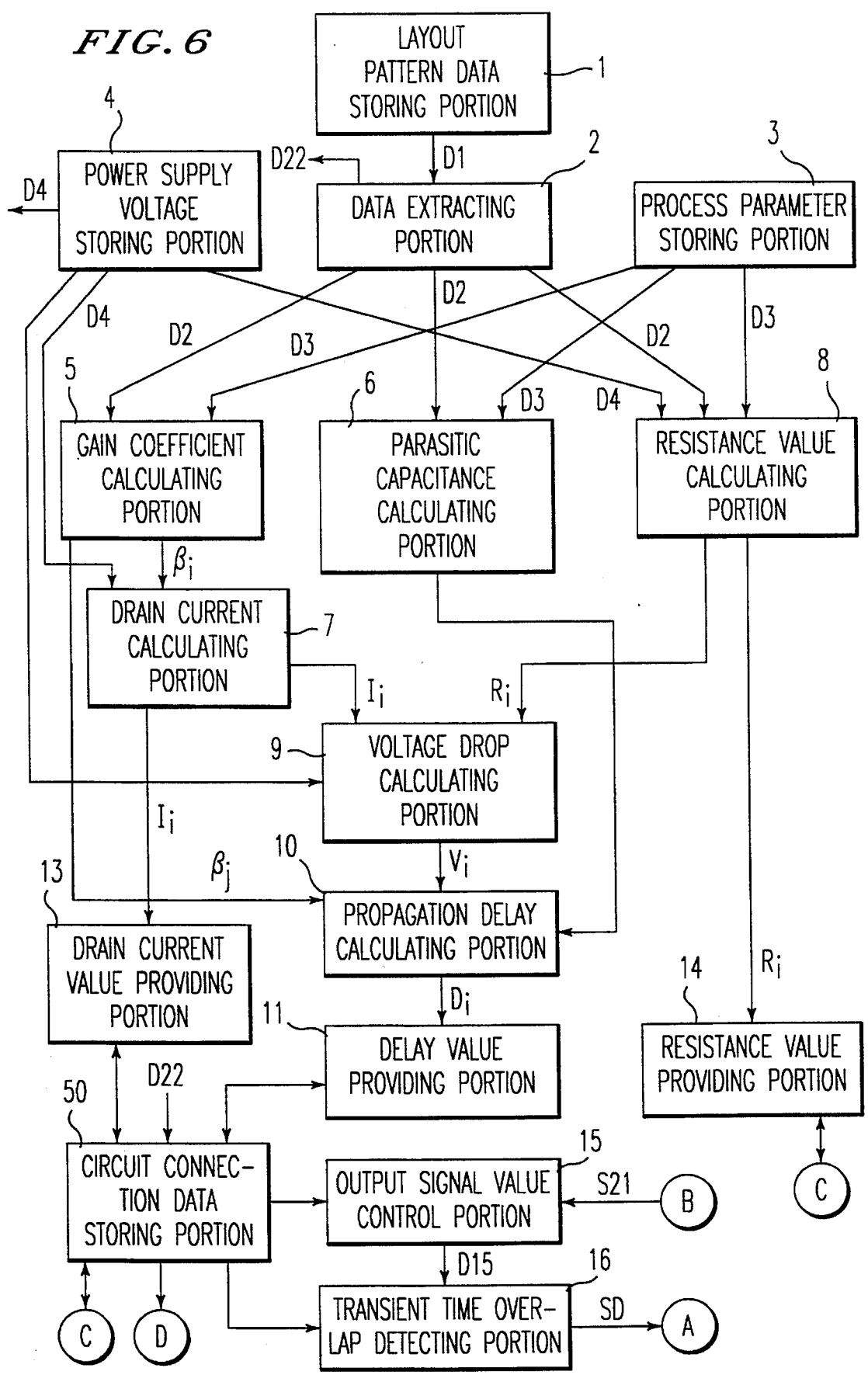
FIG. 6 is a block diagram showing configuration of a logic simulation apparatus according to the second preferred embodiment of the present invention.
Figure 7:
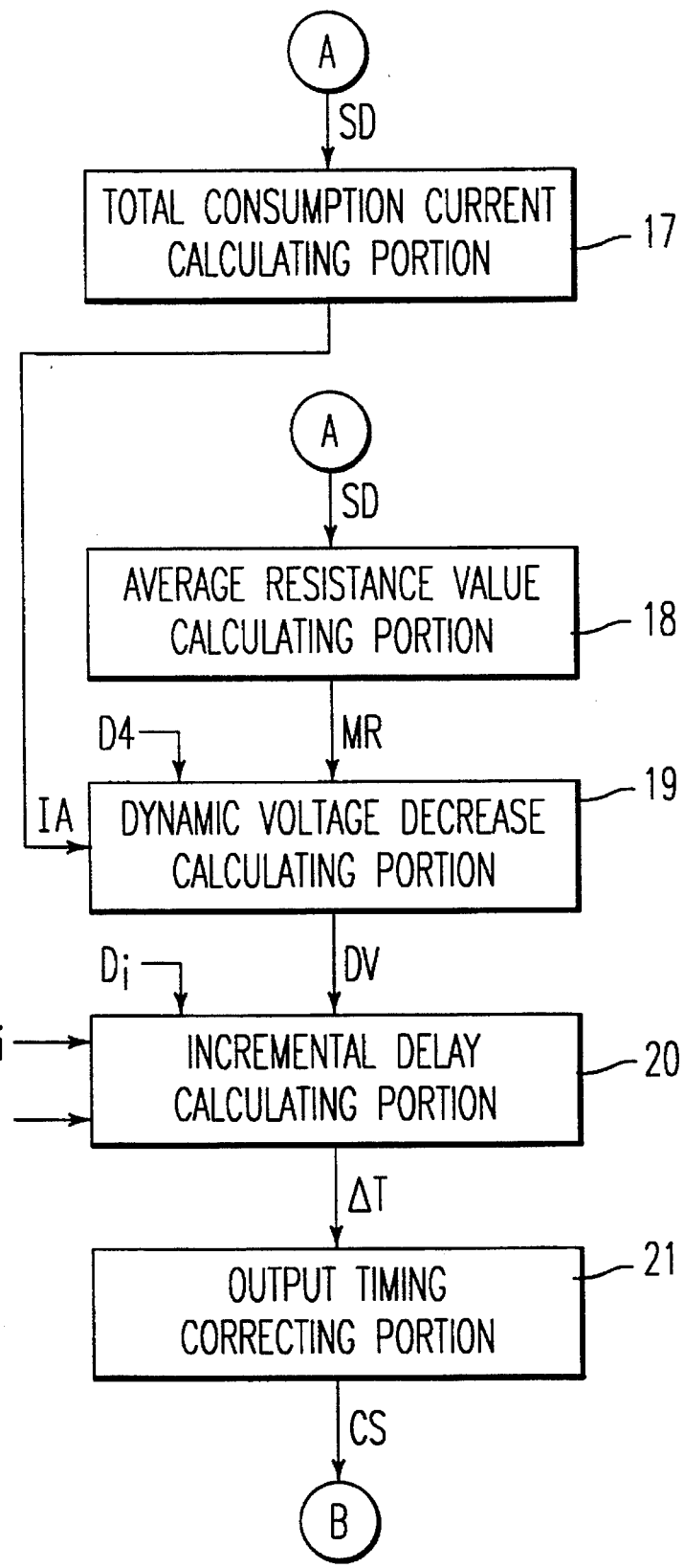
FIG. 7 is a block diagram showing configuration of the logic simulation apparatus according to the second preferred embodiment of the present invention.

FIGS. 6 and 7 are block diagrams illustrating structure of a logic simulation apparatus of the second preferred embodiment of the present invention.

In the figures, 1 through 9, 10 and 50 are almost the same as the first preferred embodiment. For example, the drain current calculating portion 7 is the same as the first embodiment except that it further outputs the drain current Ii to a drain current providing portion 13. Also, the resistance value calculating portion 8 is the same as the first preferred embodiment except that it further outputs the voltage drop resistance Ri to a resistance value providing portion 14. Accordingly, descriptions on 1 through 9, 10 and 50 are not repeated here.

A delay value providing portion 11 provides each element i in the circuit connection data D22 obtained from the circuit connection data storing portion 50 with the delay time Di obtained from the propagation delay calculating portion 10, and stores the same in the circuit connection data storing portion 50 again.

The drain current providing portion 13 provides each element i in the circuit connection data D22 obtained from the circuit connection data storing portion 50 with the drain current Ii obtained from the drain current calculating portion 7, and stores the same to the circuit connection data storing portion 50 again.

The resistance value providing portion 14 provides each element i in the circuit connection data D22 obtained from the circuit connection data storing portion 50 with the voltage drop resistance Ri obtained from the resistance value calculating portion 8, and stores the same in the circuit connection data storing portion 50 again.

An output signal control portion 15 captures the circuit connection data D22 provided with the delay time Di, the drain current I and the voltage drop resistance Ri from the circuit connection data storing portion 50 to perform the logic simulation on the basis of the circuit connection data D22. Then, if a signal change occurs at an input terminal of each element during the logic simulation, it schedules expected time of occurrence of the output signal obtained by adding the delay time Di to the present simulation time into the time queue (queue) for simulation time control. The time scheduled in the queue is still in the reservation step prior to performing the logic simulation. The output signal control portion 15 outputs the scheduled queue D15 to a transient time overlap detecting portion 16.

The transient time overlap detecting portion 16 refers to the queue D15 while the logic simulation is performed to detect a plurality of elements at which signal changes (events) being scheduled existing in the queue D15 overlap at the same time, i.e., a plurality of simultaneous transient state elements SD which are in the transient state at the same time and outputs the same to a total consumption current calculating portion 17.

The total consumption current calculating portion 17 extracts drain current values of respective ones of the plurality of simultaneous transient state elements SD during the logic simulation on the basis of the drain current Ii and calculates and outputs a total consumption current IA which is a total sum thereof to an average resistance value calculating portion 18.

The average resistance value calculating portion 18 calculates a resistance value for each of the plurality of simultaneous transient state elements SD while the logic simulation is performed on the basis of the voltage drop resistance Ri and outputs the average resistance value MR which is an average value thereof to a dynamic voltage drop calculating portion 19. The dynamic voltage drop calculating portion 19 calculates a dynamic voltage drop value DV which is a voltage drop value at a source terminal at the time of turn-on of each simultaneous transient state element SD on the basis of the power-supply information D4, the total consumption current IA and the average resistance value MR during the logic simulation and outputs the same to an incremental delay calculating portion 20.

The incremental delay calculating portion 20, while the logic simulation is being performed, on the basis of the gain coefficient $\beta i$, the interconnection parasitic capacitance Cj and the dynamic voltage drop value DV, calculates a delay time Di' required for each element to propagate a logic signal and outputs an incremental delay time $\Delta T$ obtained by taking a difference from the delay time Di calculated in the delay value providing portion 11 to an output timing correcting portion 21.

The output timing correcting portion 21 outputs a schedule correction value CS for correcting the schedule in the queue to an output signal control portion 15 on the basis of the incremental delay time $\Delta T$ during the logic simulation.

The output signal control portion 15 changes the schedule of queue on the basis of the schedule correction value Cs when it receives the schedule correction value CS.

Figure 8:
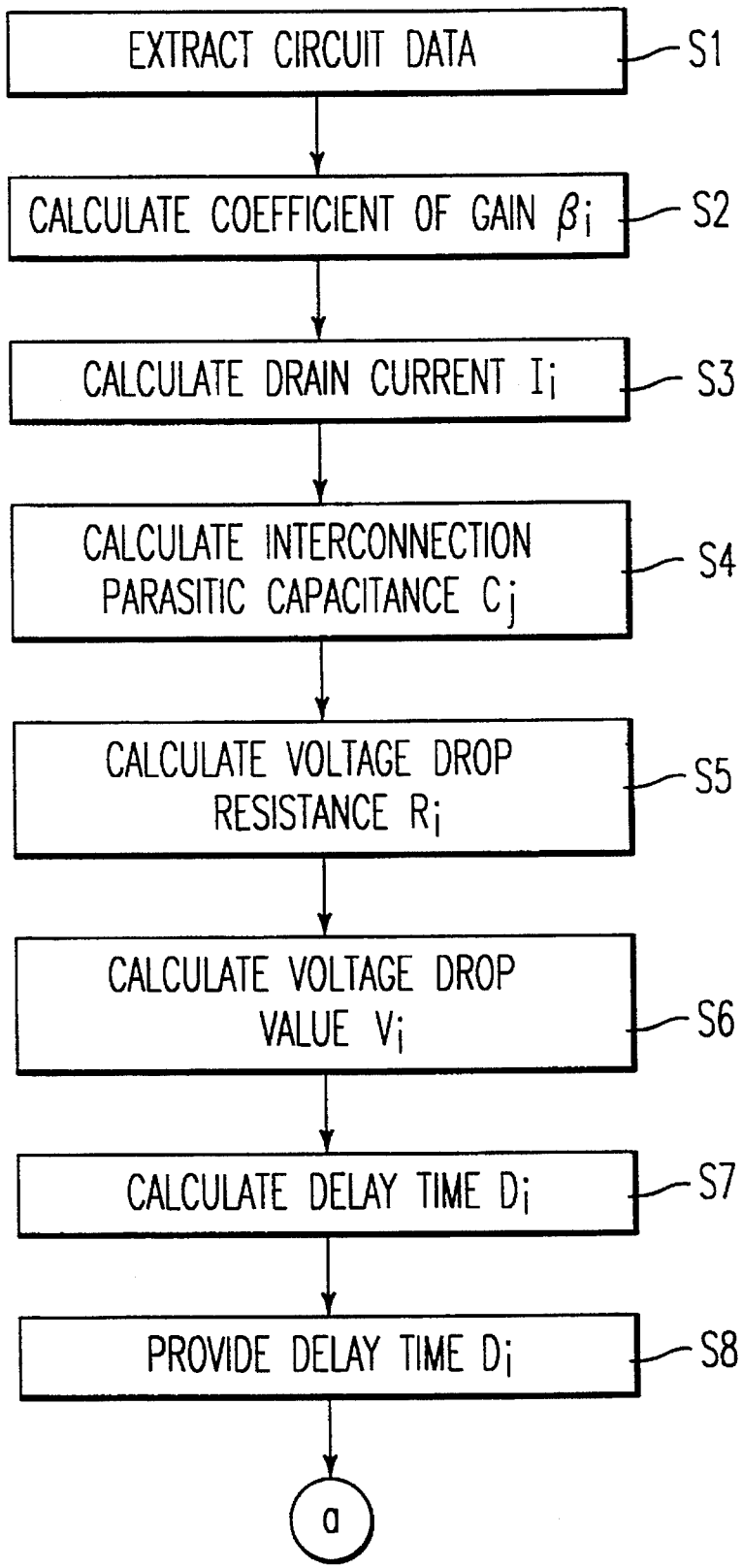
FIG. 8 is a flow chart illustrating operation of the second preferred embodiment.
Figure 9:
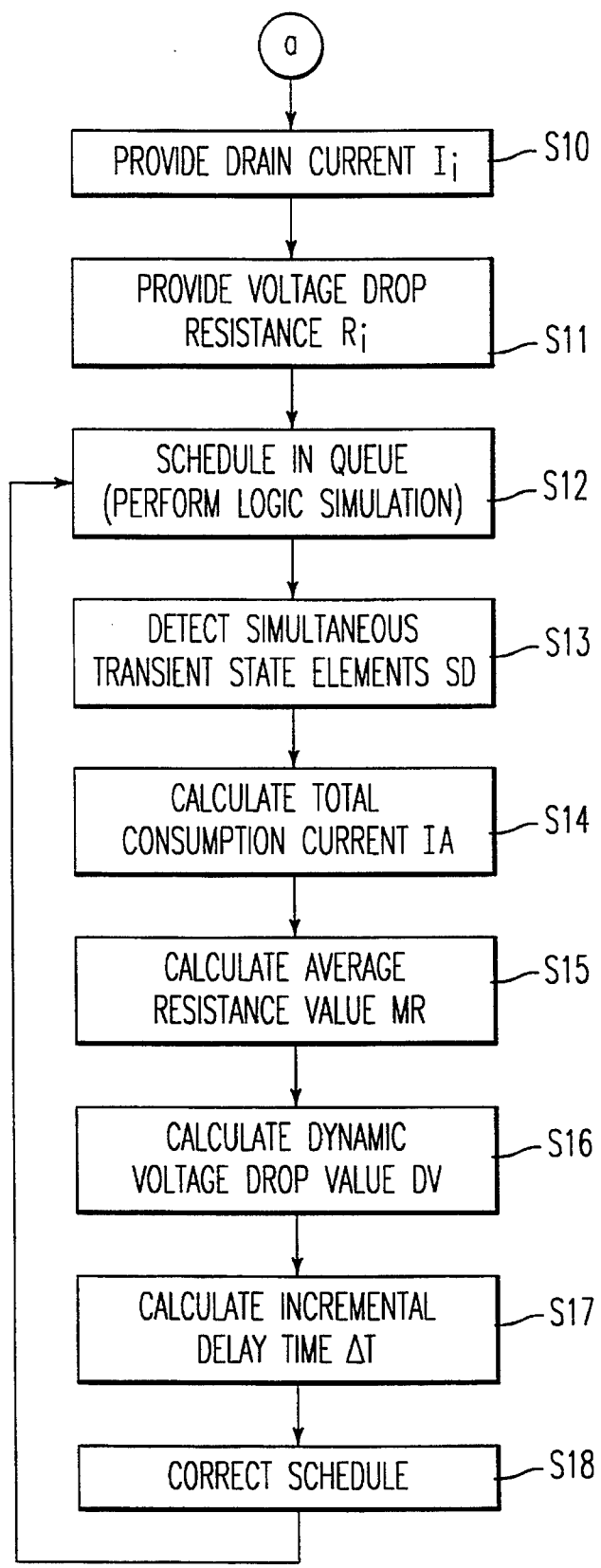
FIG. 9 is a flow chart illustrating operation of the second preferred embodiment.

FIGS. 8 and 9 are flow charts illustrating operation of the logic simulation apparatus of the second preferred embodiment. Descriptions are given below on the operation referring to the figures. Since the operations in steps S1 to S8 are the same as the first preferred embodiment, however, descriptions thereof are not repeated here.

When step S8 is finished, in step S10, the drain current providing portion 13 captures the circuit connection data D22 from the circuit connection data storing portion 50, provides each element i in the circuit connection data D22 with the drain current Ii, and stores again the circuit connection data provided with the drain current Ii into the circuit connection data storing portion 50.

For example in the circuit example shown in FIG. 3, current I1 is set as the drain current Ii for the inverter 29 and current I2 is set as the drain current Ii for the inverter 30.

Then, in step S11, the resistance value providing portion 14 captures the circuit connection data D22 from the circuit connection data storing portion 50, provides the voltage drop resistance Ri to each element i in the circuit connection data D22, and stores again the circuit connection data D22 provided with the voltage drop resistance Ri into the circuit connection data storing portion 50.

Then, in step S12, the output signal control portion 15, while performing the logic simulation on the basis of the circuit connection data D22 captured from the circuit connection data storing portion 50, schedules (reserves) a signal change occurrence expected time of an output signal obtained by adding the delay time Di to the present simulation time in the queue if a signal change takes place at an input terminal of each element.

Figure 10:
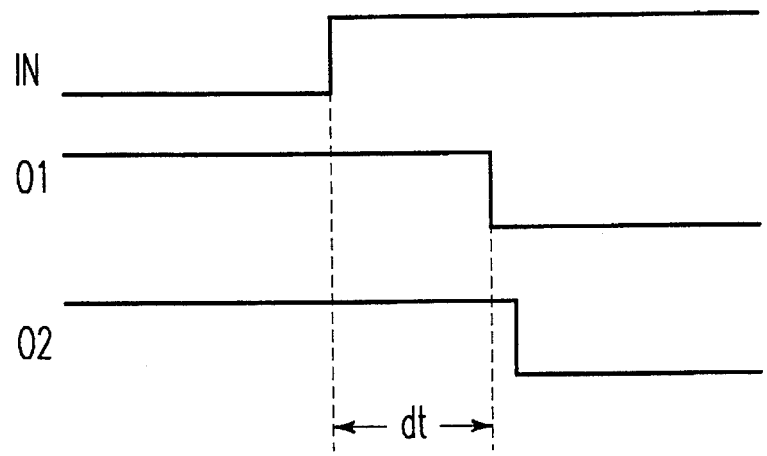
FIG. 10 is a timing chart for illustrating operation of the preferred embodiment.

Then, in step S13, during the logic simulation, a transient time overlap detecting portion 16 detects a plurality of elements in which signal changes (events) being scheduled existing in the queue overlap at the same time, i.e., a plurality of simultaneous transient state elements SD which are in the transient state at the same time. For example, if the signal changes at the inverter 29 and the inverter 30 shown in FIGS. 3 and 4 are those shown in FIG. 10, the inverter 29 and the inverter 30 are the plurality of simultaneous transient state elements SD in the period dt.

Next, in step S14, the total consumption current calculating portion 17 extracts the drain current Ii of the simultaneous transient state elements SD while the logic simulation is performed and calculates the total consumption current IA which is a total sum thereof.

The total consumption current IA, however, is determined by the expression 7 below with the drain current Ii of the simultaneous transient state elements SD and the number of the elements k.

$$IA = \sum_{i=1}^{k} \{Ii\} \tag{7}$$

Next, in step S15, during the logic simulation, on the basis of the voltage drop resistance Ri, the average resistance value calculating portion 18 extracts a voltage drop resistance value for each of the plurality of simultaneous transient state elements and calculates an average resistance value MR obtained by finding an average thereof.

Then, in step S16, while the logic simulation is performed, the dynamic voltage drop calculating portion 19 applies the expression 8 to calculate a dynamic voltage drop value DV at a source terminal at tun-on of each of the simultaneous transient state elements SD on the basis of the power-supply voltage $V_{DD}$ of the power-supply information D4, the total consumption current IA and the average resistance value MR.

$$DV = V_{DD} - (IA \times MR) \tag{8}$$

Next, in step S17, while the logic simulation is performed, on the basis of the gain coefficient $\beta i$, the interconnection parasitic capacitance Cj and the dynamic voltage drop value DV, the incremental delay calculating portion 20 calculates the delay time Di' required for propagation through the simultaneous transient state elements SD by applying the expression 9, and calculates the incremental delay time $\Delta T$ which is obtained by subtracting the delay time Di calculated in the delay value providing portion 11 from the delay time Di'.

$$Di' = fd(\beta i, Cj, dV) \tag{9}$$

Then, in step S18, the output timing correcting portion 21 outputs a schedule correction value CS for correcting the schedule in the queue to the output signal control portion 15 on the basis of the incremental delay time $\Delta T$ calculated in the incremental delay calculating portion 20 while the logic simulation is performed.

Then, returning to step S12, the output signal control portion 15 receives the schedule correction value CS and re-schedules the queue on the basis of the schedule correction value CS to proceed the logic simulation.

As described above, in the logic simulation apparatus of the second preferred embodiment, the logic simulation can be accomplished with further more precise signal propagation delay time for elements because the delay time Di calculated in the delay value providing portion 11 is corrected in consideration of the dynamic voltage drop value DV due to occurrence of the plurality of simultaneous transient state elements SD.

That is to say, in the second preferred embodiment, the signal propagation delay time is obtained by modeling the nature described below. That is, if a plurality of elements operate (turn on) at the same time and great current flows on the power-supply line momentarily, then the voltage drop due to the interconnection resistance of power-supply line is large and the drain voltage becomes abnormally small, with the result that the signal propagation delay time becomes lager than the case in which a single element operates.

<Third Preferred Embodiment>

Figure 12:
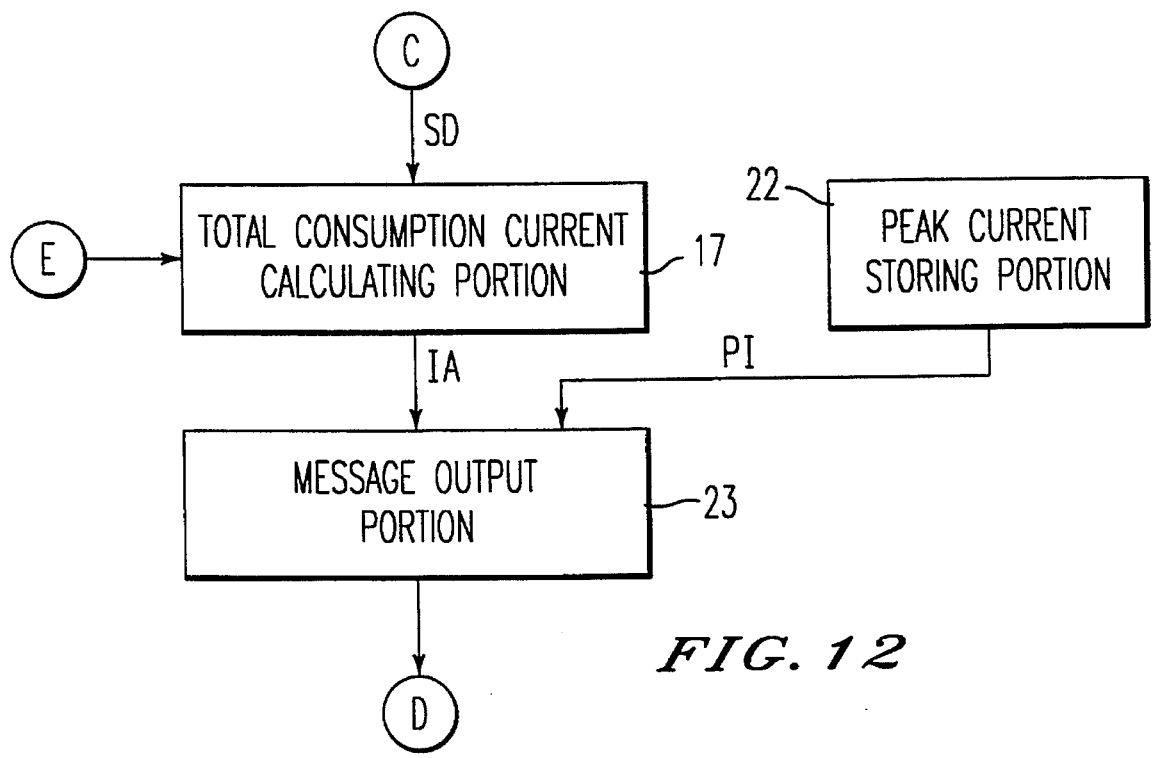
FIG. 12 is a block diagram showing configuration of the logic simulation apparatus according to the third preferred embodiment of the present invention.
Figure 11:
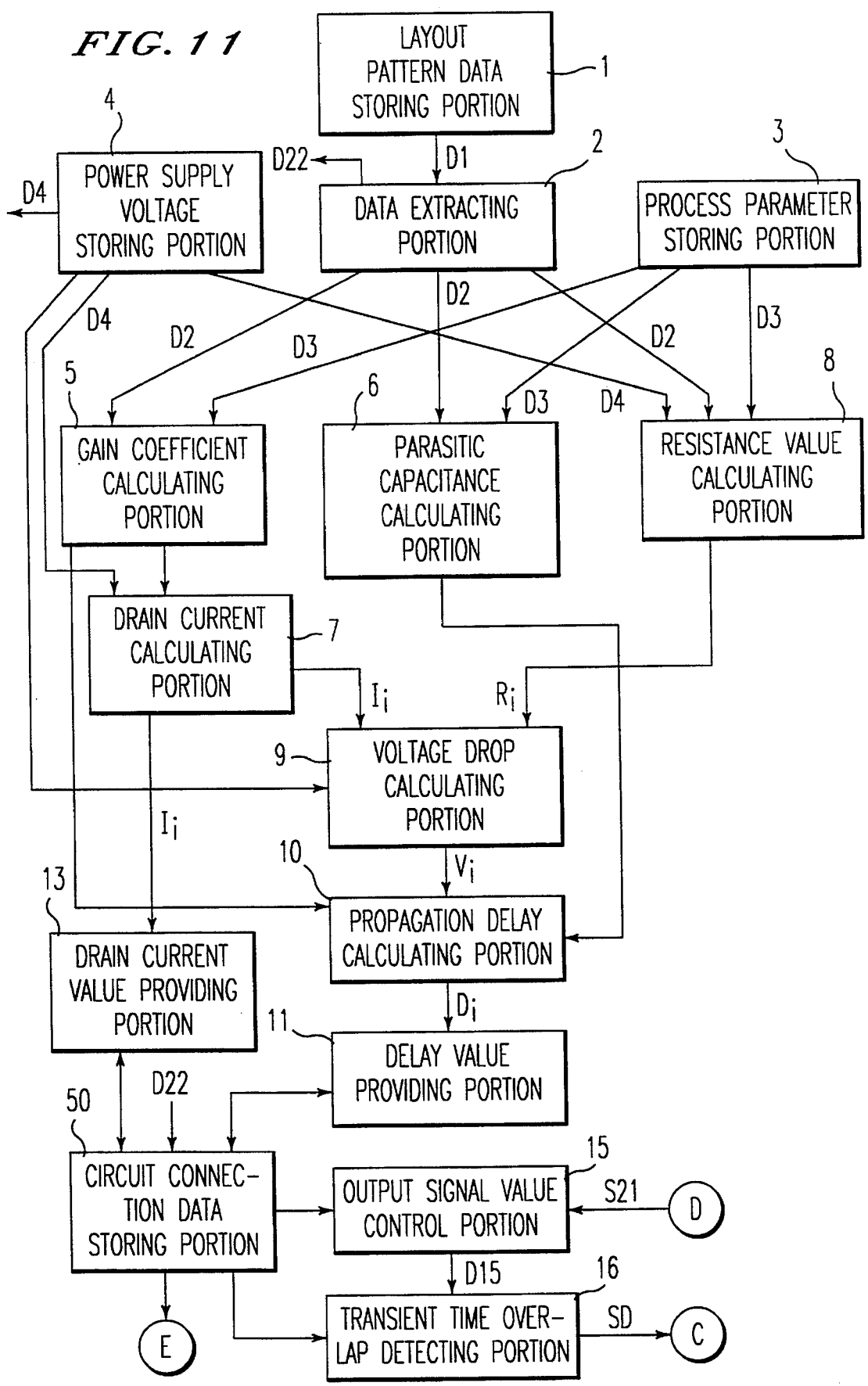
FIG. 11 is a block diagram showing configuration of a logic simulation apparatus according to the third preferred embodiment of the present invention.

FIGS. 11 and 12 are block diagrams showing structure of a logic simulation apparatus according to the third preferred embodiment of the present invention.

In the figures, 1 through 6, 8 through 10 and 50 are almost the same as the first preferred embodiment, so that the description thereof is not repeated here. Also, since 7, 13, 15 through 17 are the almost same as the second preferred embodiment, and description thereof is not repeated.

A peak current storing portion 22 stores a peak current maximum value PI in the permitted range in which the logic circuit normally operates.

A massage outputting portion 23 compares the total consumption current IA calculated in the total consumption current calculating portion 17 and the peak current maximum value PI to output a warning message WM to the output signal control portion 15 if IA>PI.

Figure 13:
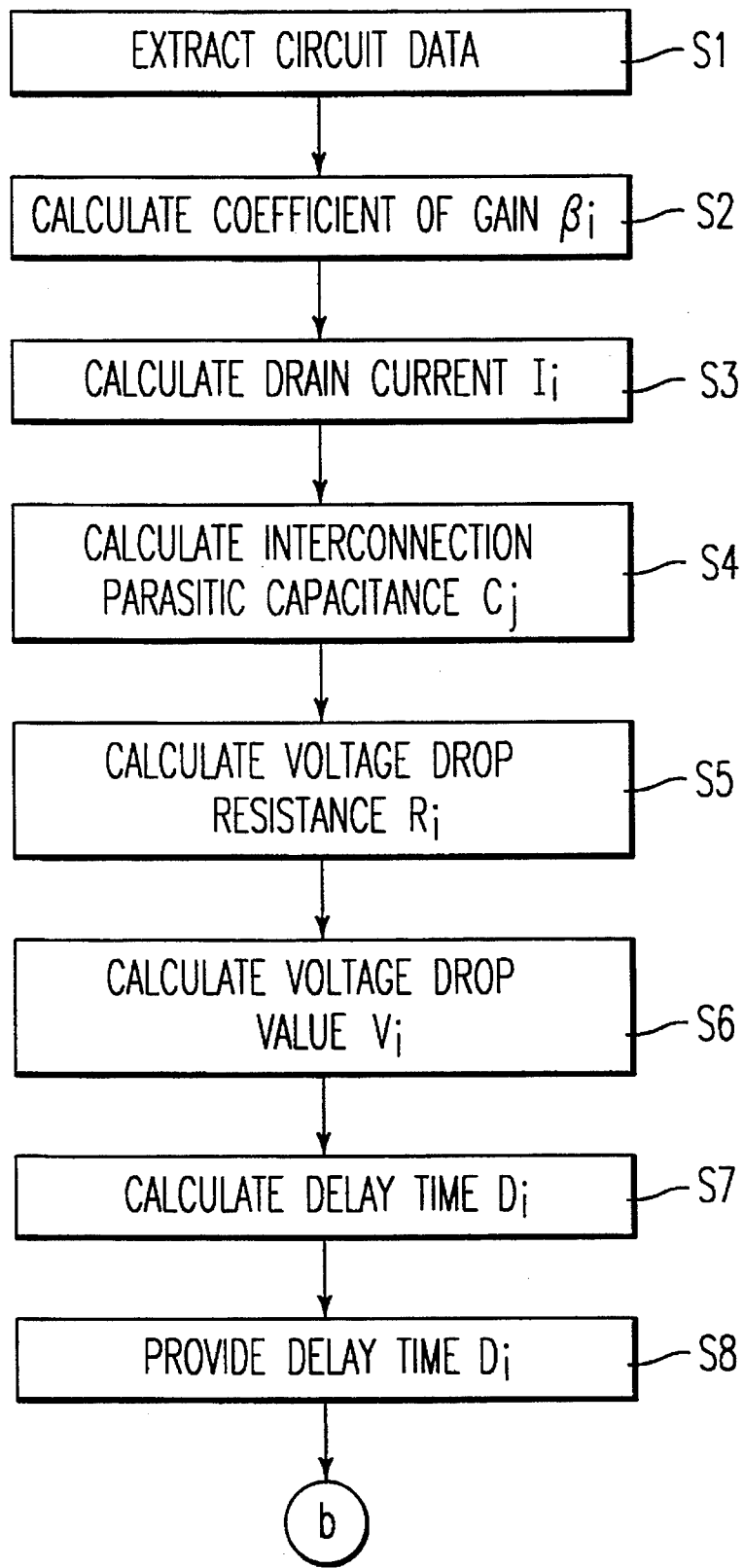
FIG. 13 is a flow chart illustrating operation of the third preferred embodiment.
Figure 14:
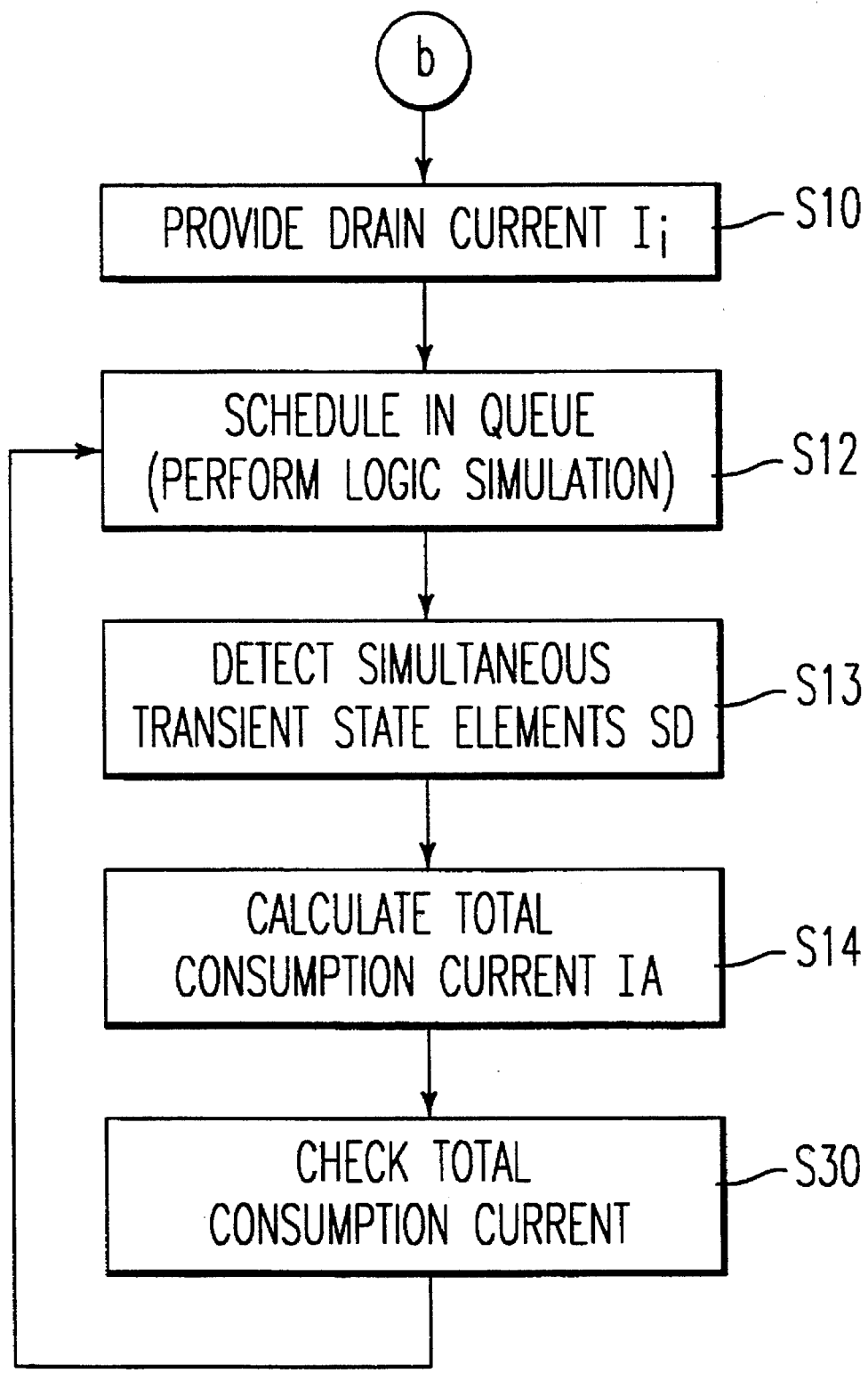
FIG. 14 is a flow chart illustrating operation of the third preferred embodiment.

FIGS. 13 and 14 are flow charts illustrating operation of the logic simulation apparatus of the third preferred embodiment. Description will be given on the operation on the basis of the figures. The operations in steps S1 to S8 are the same as the first preferred embodiment, and description thereof is not repeated here.

When step S8 is finished, in step S10, the drain current providing portion 13 captures the circuit connection data D22 from the circuit connection data storing portion 50, provides each element i in the circuit connection data D22 with the drain current Ii, and stores again the circuit connection data provided with the drain current Ii in the circuit connection data storing portion 50.

Then, in step S12, on the basis of the circuit connection data D22 provided with the delay time Di and the drain current Ii captured from the circuit connection data storing portion 50, the output signal control portion 15 performs the logic simulation, and if a signal change occurs at an input terminal of each element, schedules (reserves) in the queue a signal change occurrence expected time of an output signal obtained by adding the delay time Di to the present simulation time.

Then, in step S13, the transient time overlap detecting portion 16, while the logic simulation is performed, detects a plurality of elements at which signal changes (events) being scheduled existing in the queue overlap at the same time, i.e., a plurality of simultaneous transient state elements SD in the transient states at the same time.

Next, in step S14, the total consumption current calculating portion 17, while the logic simulation is performed, on the basis of the drain current Ii, extracts the drain current of the simultaneous transient state elements SD and calculates the total consumption current IA which is a total sum thereof by applying the expression 7 and outputs the same to the massage output portion 23.

Then, in step S30, the massage output portion 23 compares the peak current maximum value PI obtained from the peak current storing portion 22 and the total consumption current IA obtained from the total consumption current calculating portion 17, and if IA>PI, outputs the warning message and returns to step S12. If it is not so, it returns to step S12 without any processing made.

As described above, in the third embodiment, in addition to the effects of the first embodiment, a check can be made for abnormal current supply conditions on the basis of the total consumption current IA.

<Fourth Preferred Embodiment>

Figure 15:
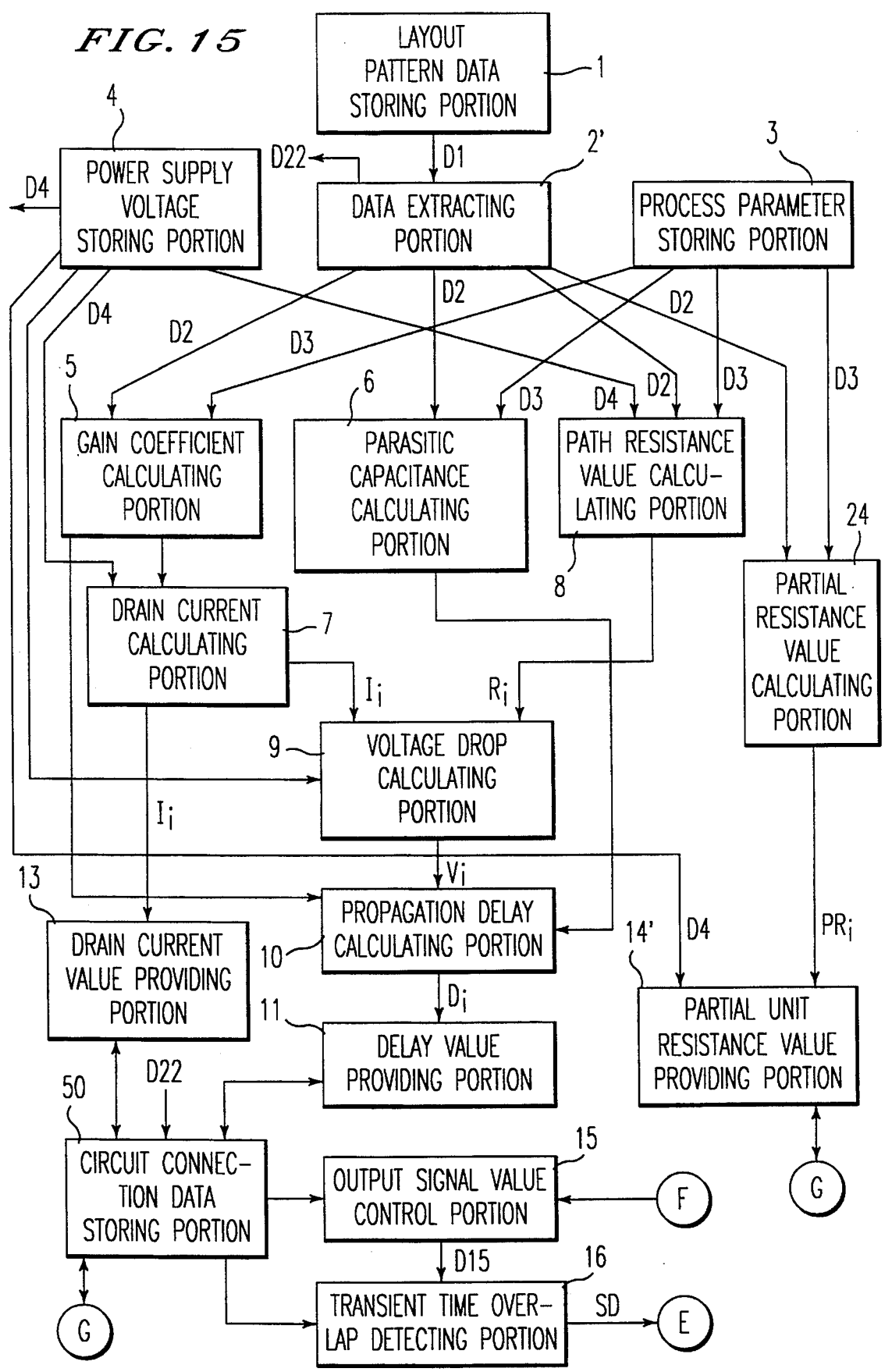
FIG. 15 is a block diagram showing configuration of a logic simulation apparatus according to the fourth preferred embodiment of the present invention.
Figure 16:
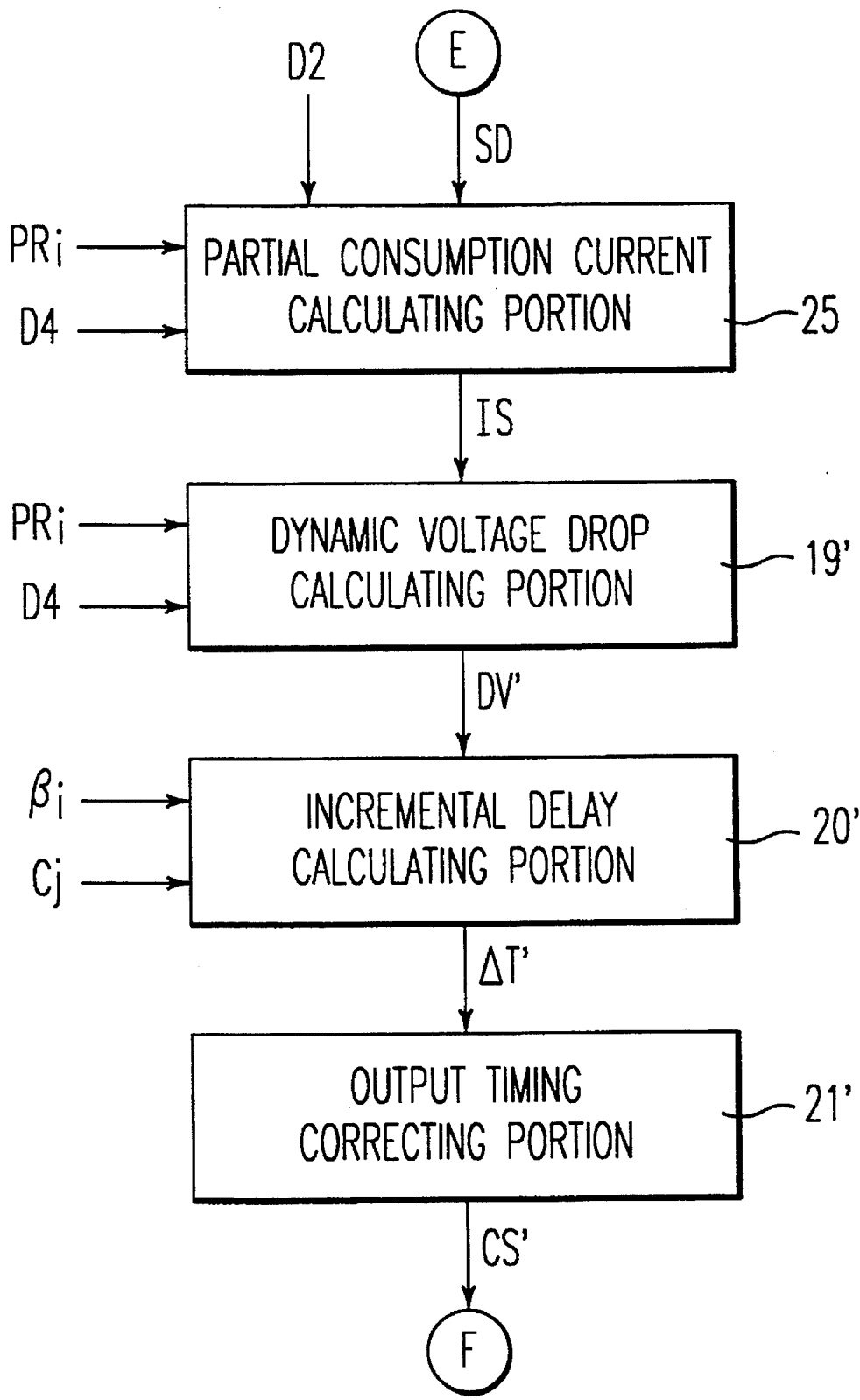
FIG. 16 is a block diagram showing configuration of the logic simulation apparatus according to the fourth preferred embodiment of the present invention.

FIGS. 15 and 16 are block diagrams showing structure of a logic simulation apparatus according to the fourth preferred embodiment of the present invention.

In the figures since 1, 3 through 6, 8 through 10 and 50 are the same as the first preferred embodiment, description thereof is not repeated. Also, 7, 13, 15 and 16 are the same as the second preferred embodiment, so that the description is not repeated thereon, either.

A data extracting portion 2' outputs to the circuit connection data storing portion 50 the circuit connection data D22 defining connection relationship among elements included in the logic circuit on the basis of the layout pattern data DI, and outputs the circuit data D2 including circuit constant data of elements, interconnection dimension data involving dimension information of diffusion region of each element and dimension information of interconnections among elements, the power-supply line information involving divided power-supply lines in which the power-supply line (PATH) from the external power-supply input terminal to each element is divided for each branch point, lengths and widths thereof, and power-supply line connection data defining the relation of connections among the divided power-supply lines to the gain coefficient calculating portion 5, the parasitic capacitance calculating portion 6, the resistance value calculating portion 8 and a partial resistance value calculating portion 24.

The partial resistance value calculating portion 24 sets partial resistance per divided power-supply line unit on the basis of the power-supply line information in the circuit data D2 and the process parameters D3, calculates a partial resistance value PRi for each partial resistance and outputs the same to a partial unit resistance value providing portion 14'.

The partial unit resistance value providing portion 14' provides the partial resistance value PRi obtained from the partial resistance value calculating portion 24 to partial resistance for each divided power-supply line for each element i in the circuit connection data D22 obtained from the circuit connection data storing portion 50, and stores the same again in the circuit connection data storing portion 50.

A partial consumption current calculating portion 25 receives the simultaneous transient state elements SD from the transient time overlap detecting portion 16, and while the logic simulation is performed, calculates partial consumption current IS flowing through the above-described partial resistance and the internal resistance when each of the plurality of simultaneous transient state elements DS turns on on the basis of the drain current Ii provided to each element i and outputs the same to a dynamic voltage drop calculating portion 19'.

While the logic simulation is performed, the dynamic voltage drop calculating portion 19', on the basis of the power-supply information D4, the partial consumption current IS and the partial resistance PRi, calculates and outputs to an incremental delay calculating portion 20' a dynamic voltage drop value DV' which is a voltage drop value at a source terminal taking place at the time when each of the simultaneous transient state elements SD turns on.

The incremental delay calculating portion 20', while the logic simulation is preformed, on the basis of the gain coefficient $\beta_i$, the interconnection parasitic capacitance $C_j$, and the dynamic voltage drop value DV', calculates delay time Di" required for each element to propagate a logic signal and compares with the delay time Di calculated in the delay value providing portion 11, and outputs incremental delay time ΔT' to the output timing correcting portion 21.

The output timing correcting portion 21, while the logic simulation is performed, outputs a schedule correction value CS' for correcting the schedule in the queue to the output signal control portion 15 on the basis of the incremental delay time ΔT'.

The output signal control portion 15, when receiving the schedule correction value CS', changes the schedule in the queue on the basis of the schedule correction value CS'.

Figure 17:
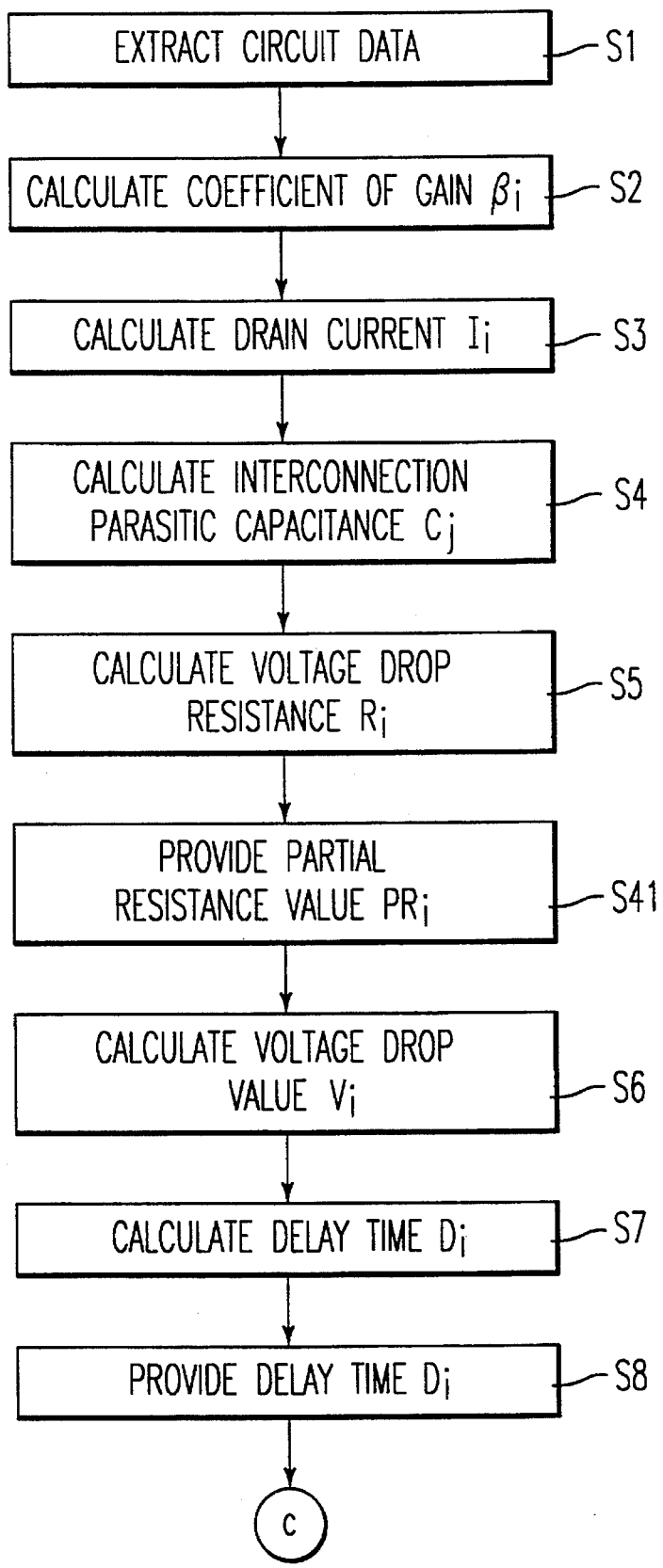
FIG. 17 is a flow chart illustrating operation of the fourth preferred embodiment.
Figure 18:
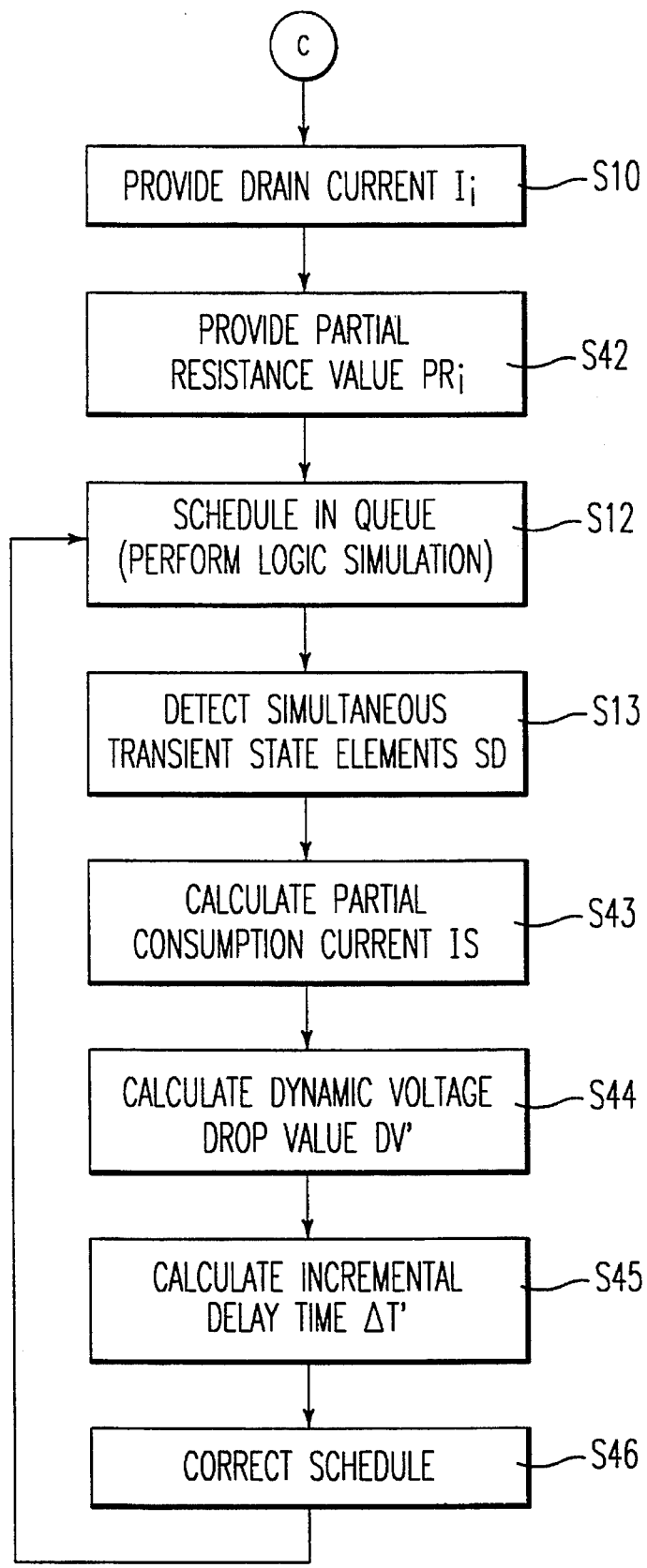
FIG. 18 is a flow chart illustrating operation of the fourth preferred embodiment.

FIGS. 17 and 18 are flow charts illustrating operation of the logic simulation apparatus of the fourth preferred embodiment. The description will be given on the operation referring to the figures. Since the operations in the steps S1 to S5 are the same as the first preferred embodiment, description thereof is not repeated.

When step S5 is finished, in step S41, on the basis of the power-supply line information in the circuit data D2 and the process parameters D3, the partial resistance value calculating portion 24 sets partial resistance on the divided power-supply line obtained by dividing the power-supply line from the external power-supply input terminal to each element for each branch point to calculate a partial resistance value PRi for each partial resistance and outputs the same to the partial unit resistance value providing portion 14'.

Then in step S6, the voltage drop calculating portion 9 applies the expression 5 to calculate a voltage drop value vi at a source terminal occurring at turn-on of each element i on the basis of the power-supply voltage value $V_{DD}$ obtained from the power-supply information D4, the drain current Ii and the voltage drop resistance Ri and outputs the same to the propagation delay calculating portion 10.

Subsequently, in step S7, on the basis of the gain coefficient βi, the interconnection parasitic capacitance Cj and the voltage drop value Vi, the propagation delay calculating portion 10 applies the expression 6 to calculate the delay time Di required for each element to propagate a logic signal value and outputs the same to the delay value providing portion 11.

Next, in step S8, the delay value providing portion 11 captures the circuit connection data D22 from the circuit connection data storing portion 50 and provides the delay time Di to each element i in the circuit connection data D22, and stores the circuit connection data provided with the delay time Di in the circuit connection data storing portion 50 again.

Then in step S10, the drain current providing portion 13 captures the circuit connection data D22 from the circuit connection data storing portion 50, provides each element i in the circuit connection data D22 with the drain current Ii, and stores the circuit connection data provided with the drain current Ii into the circuit connection data storing portion 50 again.

Next, in step S42, the partial unit resistance value providing portion 14' captures the circuit connection data D22 from the circuit connection data storing portion 50, provides the partial resistance value PRi for each partial resistance unit existing on the divided power-supply line from the external power-supply input terminal to each element to the circuit connection data D22 and stores the circuit connection data D22 provided with the partial resistance value PRi into the circuit connection data storing portion 50 again.

Then, in step S12, the output signal control portion 15 performs the logic simulation on the basis of the circuit connection data D22 captured from the circuit connection data storing portion 50, and if a signal change occurs at an input terminal of each element, schedules in the queue a signal change occurrence expected time of an output signal obtained by adding the delay time Di to the present simulation time.

Then, in step S13, the transient time overlap detecting portion 16, while the logic simulation is performed, detects a plurality of elements at which signal changes (events) being scheduled existing in the queue overlap at the same time, i.e., a plurality of simultaneous transient state elements SD being in the transient state at the same time.

Next, in step S43, while the logic simulation is being performed, on the basis of the drain current Ii and the power-supply line connection data in the circuit data D2, the partial consumption current calculating portion 25 extracts the drain current Ii of the simultaneous transient state elements SD to calculate the partial consumption current IS flowing through each partial resistance. The partial consumption current IS, however, is determined according to the Kirchhoff's first law on the basis of the drain current Ii of the simultaneous transient state elements SD and the situation of connection of the power-supply lines.

For example, in the circuit configuration shown in FIG. 4, there exist two resistances R1 and R2 as partial resistances on the path P1 because the path P1 from the external power-supply to the inverter 29 is divided at the branch point N1. Also since the path P2 from the external power-supply to the inverter 30 is divided at the branch point N1, there are two partial resistances R1 and R3 as partial resistances on the path P2.

Accordingly, the partial consumption current IS flowing through each partial resistance R1, R2 and R3 are (I1+I2), I1 and I2, respectively.

Then in step S44, while the logic simulation is being performed, the dynamic voltage drop calculating portion 19' calculates individually the dynamic voltage drop value DV' at a source terminal occurring when each simultaneous transient state element SD turns on on the basis of the power-supply voltage $V_{DD}$ of the power-supply information D4, the partial consumption current IS and the partial resistance value PRi.

In the circuit example shown in FIG. 3, the voltage drop dV1 for the partial resistance R1 which is the internal resistance of the power-supply $V_{DD}$ is (I1+ I2)×R1, the voltage drop dV2 for the partial resistance R2 is I1×R2, and the voltage drop dV3 for the partial resistance R3 is I2×R3. As a result, the dynamic voltage drop value DV' which occurs in the inverter 29 is ($V_{DD}$×(dV1+dV2)) and the dynamic voltage drop value DV' which occurs in the inverter 30 is calculated as ($V_{DD}$−(dV1+dV3)).

Next, in step S45, while the logic simulation is performed, on the basis of the gain coefficient βi, the interconnection parasitic capacitance Cj and the dynamic voltage drop value DV', the incremental delay calculating portion 20' applies the expression 10 to calculate a delay time Di" required to propagate through the simultaneous transient state elements SD and calculates an incremental delay time ΔT' obtained by subtracting the delay time Di calculated in the delay value providing portion 11 from the delay time Di".

$$Di"=fd(\beta i, Cj, DV') \tag{10}$$

Then in step S46, the output timing correcting portion 21' outputs to the output signal control portion 15 a schedule correction value CS' for correcting the schedule in the queue on the basis of the incremental delay time ΔT' calculated in the incremental delay calculating portion 20 while the logic simulation is performed.

Then it returns to step S12, and the output signal control portion 15, receiving the schedule correction value CS', re-schedules the queue on the basis of the schedule correction value CS' and proceeds the logic simulation.

As described above, in the logic simulation apparatus of the fourth preferred embodiment, as in the second preferred embodiment, the delay time Di calculated in the delay value providing portion 11 is corrected in consideration of the dynamic voltage drop value DV' due to occurrence of the simultaneous transient state elements SD, resulting in the logic simulation with more precise signal propagation delay time for elements.

In addition, when obtaining the dynamic voltage drop value DV', since the consumption current from the power-supply line to each simultaneous transient state element SD is obtained accurately on the basis of the partial resistance value PRi occurring in partial resistance provided on the divided power-supply line which is divided at branch points, the preciseness of the dynamic voltage drop value DV' in the fourth preferred embodiment is higher than that of the dynamic voltage drop value DV calculated in the second preferred embodiment.

Accordingly, according to the fourth preferred embodiment, a logic simulation apparatus with more precise signal propagation time for elements is provided as compared with the second preferred embodiment.

<Fifth Preferred Embodiment>

Figure 19:
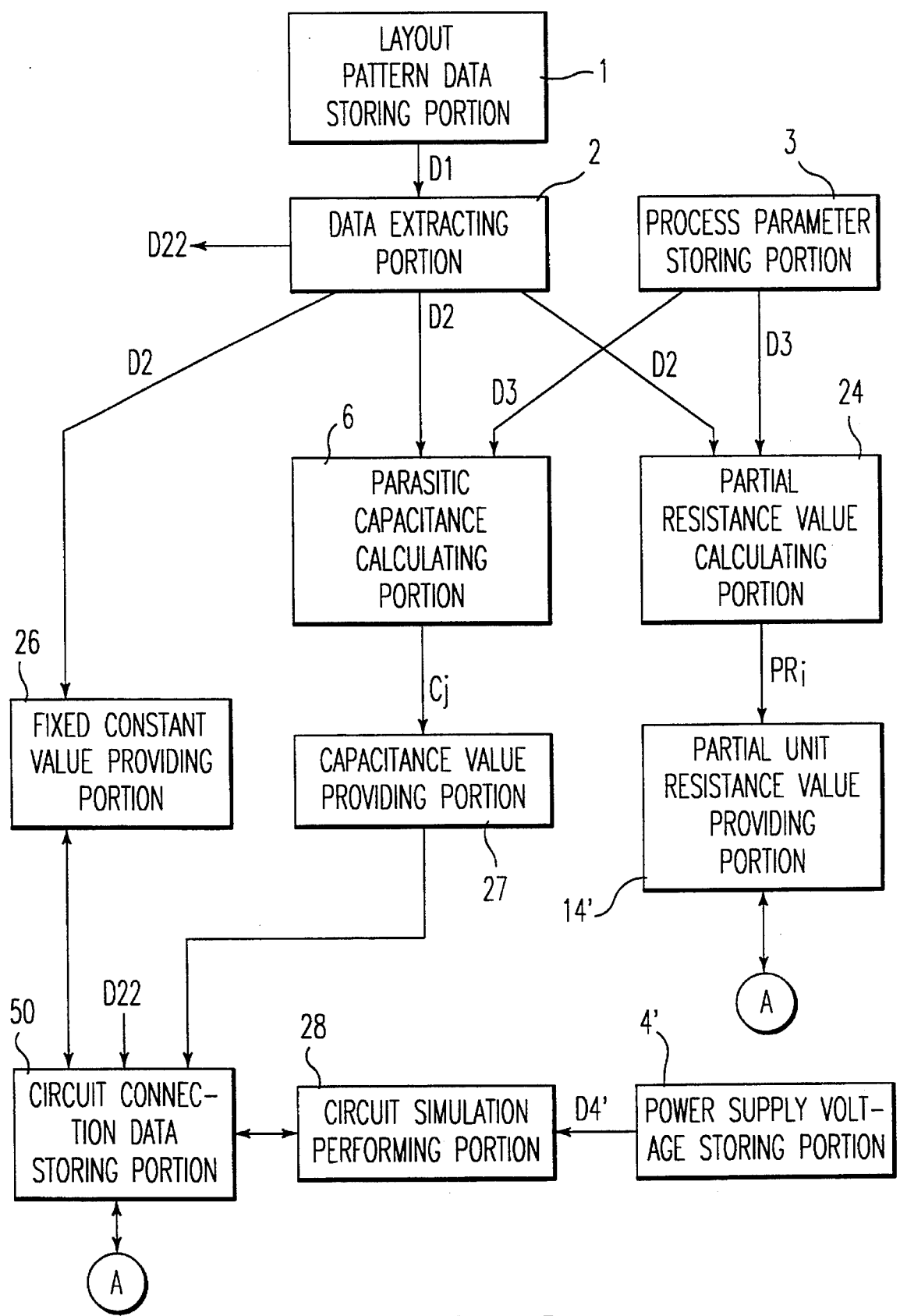
FIG. 19 is a block diagram showing configuration of a logic simulation apparatus according to the fifth preferred embodiment of the present invention.

FIG. 19 is a block diagram showing structure of a logic simulation apparatus according to the fifth preferred embodiment of the present invention.

In the figure, 1 through 3, 6 are the same as the first embodiment, and description thereof is not repeated here. Also, 24 and 14' are the same as the fourth embodiment, description thereof is no repeated.

A power-supply voltage storing portion 4' stores power-supply information D4' such as voltage values and operational conditions like temperature conditions for a power-supply for operating a logic circuit, which outputs the power-supply information D4' to a circuit simulation performing portion 28.

A fixed constant value providing portion 26 receives the circuit data D2 from the data extracting portion 2, provides the circuit constant data in the circuit data D2 to the circuit connection data D22 obtained from the circuit connection data storing portion 50 and stores the same in the circuit connection data storing portion 50 again.

A capacitance value providing portion 27 receives the interconnection parasitic capacitance Cj from the parasitic capacitance calculating portion 6, provides the circuit connection data D22 obtained from the circuit connection data storing portion 50 with the interconnection parasitic capacitance Cj and stores the same in the circuit connection data storing portion 50 again.

The circuit simulation performing portion 28 captures the circuit connection data D22 provided with the circuit constant data, the interconnection parasitic capacitance Cj and the partial resistance value PRi and performs the circuit simulation on the basis of the circuit connection data D22.

Figure 20:
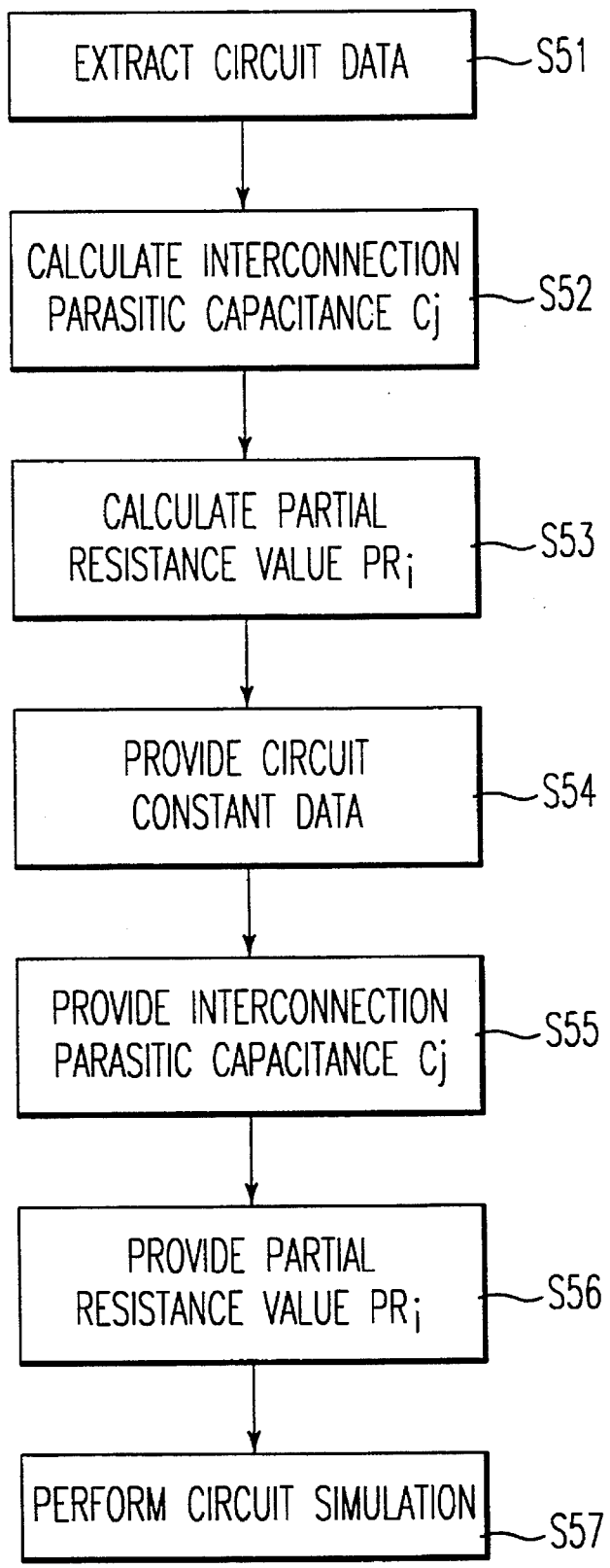
FIG. 20 is a flow chart illustrating operation of the fifth preferred embodiment.
Figure 21:
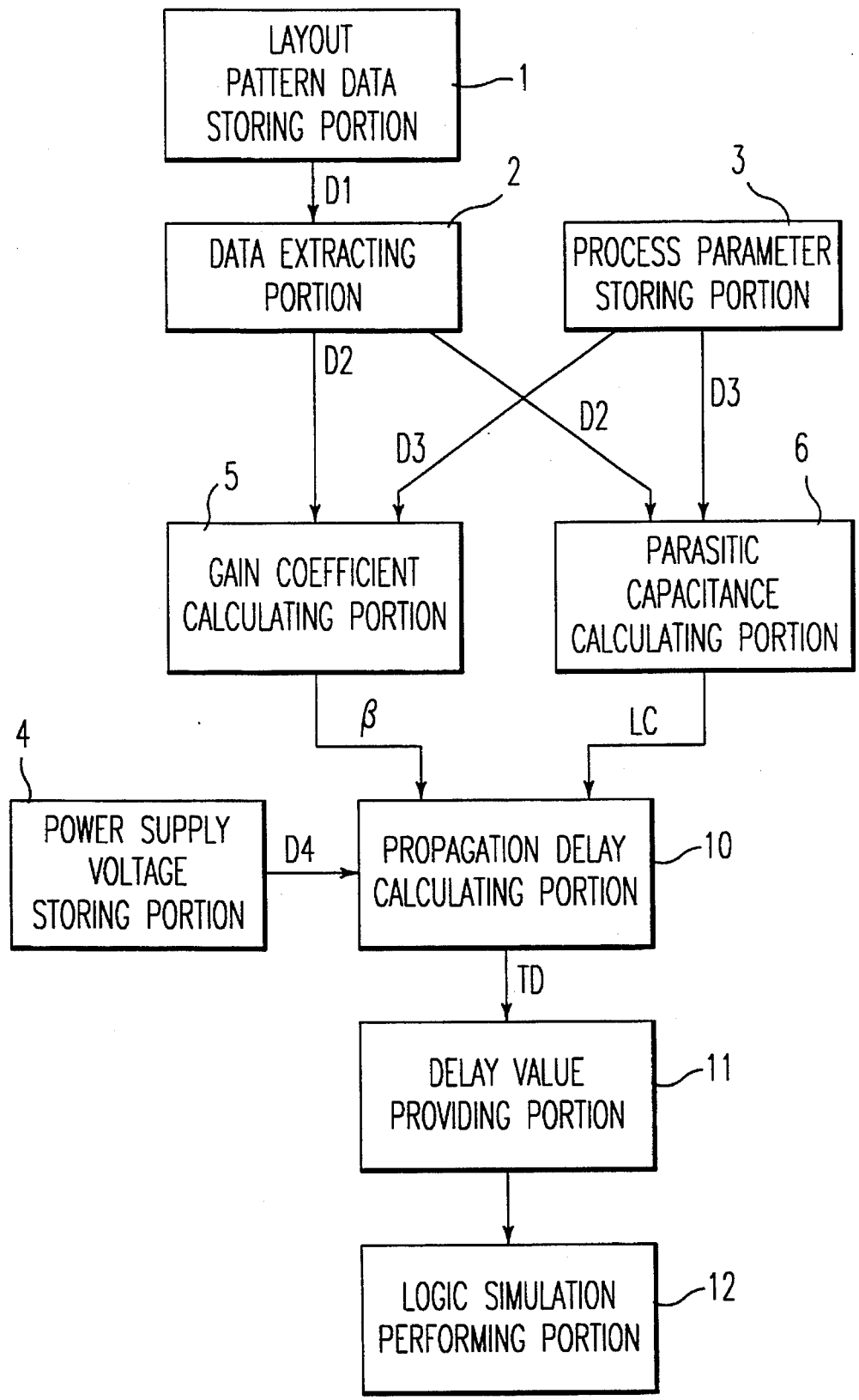
FIG. 21 is a block diagram showing configuration of a conventional logic simulation apparatus.

FIG. 20 is a flow chart illustrating operation of the logic simulation apparatus according to the fifth preferred embodiment of the present invention. The operation will be described below referring to the figure.

First, in step S51, on the basis of the layout pattern data D1 obtained from the layout pattern data storing portion 1, the data extracting portion 2 extracts the circuit data D2 including circuit connection data defining connection relation among elements in the logic circuit, circuit constant data of elements, interconnection dimension data involving dimension information of diffusion region of each element and dimension information of interconnection among elements and power-supply line information such as divided power-supply line in which power-supply line from external power-supply to each element is divided at branch points, lengths and widths thereof, and outputs the data to the parasitic capacitance calculating portion 6, the partial resistance value calculating portion 24 and the fixed constant value providing portion 26.

Next, in step S52, on the basis of the circuit constant data, the dimension information of diffusion regions, the interconnection dimension data in the circuit data D2 obtained from the data extracting portion 2 and the process parameters D3, the parasitic capacitance calculating portion 6 applies the expression 3 to obtain the interconnection parasitic capacitance Cj associated with each interconnection j and outputs the same to the capacitance value providing portion 27.

Then in step S53, on the basis of the power-supply line information in the circuit data D2 and the process parameters D3, the partial resistance value calculating portion 24 provides partial resistance for a divided power-supply line unit obtained by dividing the path of power-supply line from the external power-supply input terminal to each element for each branch point, calculates a partial resistance value PRi for each partial resistance and outputs the same to the partial unit resistance value providing portion 14'.

Next, in step S54, the circuit connection data D22 is captured from the circuit connection data storing portion 50, provided with the circuit constant data in the circuit data D2, and the circuit connection data provided with the circuit constant data is stored in the circuit connection data storing portion 50 again.

Then, in step S55, the capacitance value providing portion 27 captures the circuit connection data D22 from the circuit connection data storing portion 50, provides the interconnection parasitic capacitance Cj to the circuit connection data D22 and stores the circuit connection data provided with the circuit connection data D22 in the circuit connection data storing portion 50 again.

Next, in step S56, the partial unit resistance value providing portion 14' captures the circuit connection data D22 from the circuit connection data storing portion 50, provides the circuit connection data D22 with the partial resistance value PRi for each partial resistance unit existing on divided power-supply line from the external power-supply input terminal to each element, and stores the circuit connection data D22 provided with the partial resistance value PRi in the circuit connection data storing portion 50 again.

Finally, in step S57, the circuit simulation performing portion 28 captures the circuit connection data D22 from the circuit connection data storing portion 50 and performs the circuit simulation on the basis of the circuit connection data D22.

As described above, in the fifth preferred embodiment, since the circuit simulation is performed on the basis of the circuit connection data provided with the interconnection parasitic capacitance Cj and the partial resistance value PRi for partial resistance set for each branch point of the power-supply line, the circuit simulation can be accomplished in which the electric characteristics are analyzed with the dynamically converting voltage drop values precisely obtained to calculate signal propagation delay time for each element constituting a logic circuit.

While the invention has been shown and described in detail, the foregoing description is in all aspects illustrative and not restrictive. It is therefore understood that numerous modifications and variations can be devised without departing from the scope of the invention.

What is claimed is:

1. A logic simulation apparatus, comprising:

layout pattern data providing means for providing layout pattern data defining layout pattern of a logic circuit;

data extracting means for extracting, on the basis of said layout pattern, circuit connection data defining relation of connections among elements constituting said logic circuit, circuit constant data of said elements, interconnection dimension data including dimension information of diffusion regions forming said elements and dimension information of interconnections among each element and divided power-supply line data including a divided power-supply line, in which a power-supply line from an external power-supply input terminal to said element is divided in branch point units, a length and a width thereof;

process parameter providing means for providing a process parameter required in a process of manufacturing said logic circuit;

power-supply information providing means for providing power-supply information including a power-supply voltage value and an internal resistance value of the external power-supply for operation of said logic circuit;

gain coefficient calculating means for calculating a gain coefficient for each element of said logic circuit on the basis of said circuit constant data and said process parameter;

parasitic capacitance value calculating means for calculating an interconnection parasitic capacitance value which is a capacitance value associated with each interconnection of said logic circuit on the basis of said circuit constant data, said interconnection dimension data and said process parameter;

conduction current calculating means for calculating a conduction current value flowing when each element of said logic circuit turns on on the basis of said gain coefficient and said power-supply information;

resistance value calculating means for calculating a voltage drop resistance value which is a sum of an interconnection resistance value of the power-supply line and said internal resistance value for each element of said logic circuit on the basis of said divided power-supply line data, said process parameter and said internal resistance value of said power-supply information;

voltage drop value calculating means for calculating a voltage drop value occurring in the power-supply path extending from the external power-supply to said element when each said element of said logic circuit turns on on the basis of said power-supply voltage value of said power-supply information, said conduction current value and said voltage drop resistance value;

signal propagation delay calculating means for calculating signal propagation delay time required for each said element of said logic circuit to propagate a logic signal on the basis of said gain coefficient, said interconnection parasitic capacitance and said voltage drop value; and logic simulation performing means for performing logic simulation on the basis of said circuit connection data and said signal propagation delay time.

2. The logic simulation apparatus according to claim 1, wherein said elements include a MOS transistor, and said circuit constant data includes a channel width and a channel length of the MOS transistor.

3. The logic simulation apparatus according to claim 2, wherein said process parameter includes a gate area of the MOS transistor, a dielectric constant and a film thickness of a gate oxide film of the MOS transistor, effective surface mobility of electrons in the channel of the MOS transistor, and a sheet resistance value per unit area.

4. The logic simulation apparatus according to claim 3, wherein said conduction current includes drain current of the MOS transistor.

5. The logic simulation apparatus according to claim 1, wherein said logic simulation performing means comprises;

output signal control means for performing the logic simulation on the basis of said circuit connection data and said signal propagation delay time, and during the simulation, scheduling expected time of occurrence of an output signal into a queue for simulation time control on the basis of said signal propagation delay time every time a signal change takes place at an input terminal of the element in said logic circuit, transient time overlap detecting means for detecting a plurality of simultaneous transient state elements at which signal changes of said output signals overlap at the same time referring to the queue, total consumption current calculating means for extracting conduction current of each of said plurality of simultaneous transient state elements on the basis of said conduction current value and calculating total consumption current which is a total sum thereof, average resistance value calculating means for extracting a voltage drop resistance value for each of said plurality of simultaneous transient state elements on the basis of said voltage drop resistance value and calculating an average resistance value which is an average thereof, dynamic voltage drop calculating means for calculating a dynamic voltage drop value which is a voltage drop value occurring on a power-supply line path extending from the external power-supply to said simultaneous transient state element when said plurality of simultaneous transient state elements turn on on the basis of said power-supply voltage value of said power-supply information, said total consumption current and said average resistance value, incremental delay time calculating means for calculating incremental delay time by calculating dynamic signal propagation delay time required for each of said plurality of simultaneous transient state elements to propagate a logic signal on the basis of said gain coefficient, said interconnection parasitic capacitance value and said dynamic voltage drop value and taking a difference from said signal propagation delay time of each of said plurality of simultaneous transient state elements, and output signal correcting means for changing the expected time of occurrence of said output signal in said queue on the basis of said incremental delay time.

6. The logic simulation apparatus according to claim 1 wherein said logic simulation performing means comprises;

output signal control means for performing the logic simulation on the basis of said circuit connection data and said signal propagation delay time, and during the simulation, scheduling expected time of occurrence of an output signal into a queue for simulation time control on the basis of said signal propagation delay time every time a signal change takes place at an input terminal of the element in said logic circuit, transient time overlap detecting means for detecting a plurality of simultaneous transient state elements at which signal changes of said output signals overlap in time referring to said queue, total consumption current calculating means for extracting conduction current for each of said plurality of simultaneous transient state elements on the basis of said circuit connection data and said conduction current value and calculating a total consumption current which is a total sum thereof, and message outputting means for outputting a warning message if said total consumption current exceeds a predetermined reference value.

7. The logic simulation apparatus according to claim 1, wherein the divided power-supply line data extracted by said data extracting means further includes power-supply line connection data defining connection relation of said divided power-supply line, said logic simulation apparatus further comprises partial resistance value calculating means for calculating a partial resistance value which is a resistance value of partial resistance per said divided power-supply line unit on the basis of said divided power-supply line data and said precess parameters, and said logic simulation performing means comprises, output signal control means for scheduling expected time of occurrence of an output signal into the queue for simulation time control on the basis of said signal propagation delay time every time a signal change takes place at an input terminal of the element in said logic circuit while performing the logic simulation on the basis of said circuit connection data and said signal propagation delay time, transient time overlap detecting means for detecting a plurality of simultaneous transient state elements at which occurrence of a signal change of said output signal overlaps in time referring to said queue, partial consumption current calculating means for calculating partial consumption current flowing through each of said internal resistance of said external power-supply and said partial resistance on the basis of said divided power-supply line data, said power-supply information, said partial resistance value and said conduction current value, dynamic voltage drop calculating means for calculating a dynamic voltage drop value which is a voltage drop value occurring on a signal path extending from the external power-supply to said simultaneous transient state elements when each of said plurality of simultaneous transient state elements turns on on the basis of the power-supply voltage value and the internal resistance value of said power-supply information, said partial consumption current and said partial resistance value, incremental delay time calculating means for calculating incremental delay time by calculating dynamic signal propagation delay time required for each of said plurality of simultaneous transient state elements to propagate a logic signal on the basis of said gain coefficient, said interconnection parasitic capacitance value and said dynamic voltage drop value and taking a difference from said signal propagation delay time of each of said plurality of simultaneous transient state elements, and output signal correcting means for changing the expected time of occurrence of said output signal in said queue on the basis of said incremental delay time.

8. A circuit simulation apparatus comprising:

layout pattern data providing means for providing layout pattern data defining layout pattern of a logic circuit;

data extracting means for extracting, on the basis of said layout pattern, circuit connection data defining connection relation among elements forming said logic circuit, circuit constant data of said elements, interconnection dimension data including dimension information of diffusion regions forming said elements and dimension information of interconnections among said elements, and divided power-supply line data including divided power-supply line, with the power-supply line being divided per unit of branch point from an external power-supply input terminal to said elements, length and width thereof and power-supply line connection data defining connection relation of said divided power-supply line;

precess parameter providing means for providing process parameters required in a process of manufacturing said logic circuit;

power-supply information providing means for providing power-supply information including a power-supply voltage value and an internal resistance value of the external power-supply for operation of said logic circuit;

parasitic capacitance value calculating means for calculating an interconnection parasitic capacitance value which is a capacitance value associated with each interconnection of said logic circuit on the basis of said circuit constant data, said interconnection dimension data and said process parameters;

partial resistance value calculating means for calculating a partial resistance value which is a resistance value of a partial resistance for each said divided power-supply line unit on the basis of said divided power-supply line data and said process parameters; and circuit simulation performing means for performing the circuit simulation on the basis of said circuit connection data, said power-supply information, said circuit constant data, said interconnection parasitic capacitance value and said partial resistance value.

* * * * *